(12) United States Patent
Lazo Martinez et al.

(10) Patent No.: US 12,218,281 B2
(45) Date of Patent: Feb. 4, 2025

(54) DISPLAY DEVICE INCLUDING ELECTRIC FIELD FORMING AUXILIARY ELECTRODE AND METHOD OF MANUFACTURING THE SAME

(71) Applicant: Samsung Display Co., LTD., Yongin-si (KR)

(72) Inventors: Israel Esteban Lazo Martinez, Yongin-si (KR); Yun Jang, Yongin-si (KR); Suk Hoon Kang, Yongin-si (KR); Seung Beom Park, Yongin-si (KR); Duck Jong Suh, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 461 days.

(21) Appl. No.: 17/590,488

(22) Filed: Feb. 1, 2022

(65) Prior Publication Data

US 2023/0008241 A1    Jan. 12, 2023

(30) Foreign Application Priority Data

Jul. 7, 2021   (KR) ......................... 10-2021-0089268

(51) Int. Cl.
*H01L 33/38*  (2010.01)
*H01L 33/00*  (2010.01)
(Continued)

(52) U.S. Cl.
CPC .......... *H01L 33/387* (2013.01); *H01L 33/005* (2013.01); *H01L 33/405* (2013.01);
(Continued)

(58) Field of Classification Search
CPC . H01L 25/0753; H01L 25/167; H01L 27/124; H01L 27/1251; H01L 27/1255;
(Continued)

(56) References Cited

U.S. PATENT DOCUMENTS 9,773,761 B2   9/2017  Do
2011/0089850 A1   4/2011  Shibata et al.
(Continued)

FOREIGN PATENT DOCUMENTS

KR   10-2011-0041401   4/2011
KR   10-2018-0046494   5/2018
(Continued)

OTHER PUBLICATIONS

Hoo Keun Park et al,. "Horizontally assembled green InGaN nanorod LEDs: scalable polarized surface emitting LEDs using electric-field assisted assembly", Scientific Reports, Jun. 21, 2016, pp. 1-9, vol. 6, No. 28312.
(Continued)

*Primary Examiner* — Cheung Lee
(74) *Attorney, Agent, or Firm* — KILE PARK REED & HOUTTEMAN PLLC

(57) ABSTRACT

According to an embodiment of the disclosure, a display device includes a first electrode and a second electrode that are disposed on a substrate and spaced apart from each other, a light emitting element disposed between the first electrode and the second electrode, and an auxiliary electrode disposed on the substrate and overlapping the light emitting element such that the auxiliary electrode forms an electric field in an area where the light emitting element is disposed.

29 Claims, 20 Drawing Sheets

(51) Int. Cl.
*H01L 33/40* (2010.01)
*H01L 33/62* (2010.01)

(52) U.S. Cl.
CPC ...... *H01L 33/62* (2013.01); *H01L 2933/0016* (2013.01); *H01L 2933/0066* (2013.01)

(58) Field of Classification Search
CPC ......... H01L 27/14601; H01L 27/14612; H01L 27/14629; H01L 27/156; H01L 33/005; H01L 33/20; H01L 33/387; H01L 33/405; H01L 33/483; H01L 33/62; H01L 2933/0016; H01L 2933/0066
See application file for complete search history.

(56) References Cited

U.S. PATENT DOCUMENTS

| | | |
|---|---|---|
| 2021/0151419 A1 | 5/2021 | Lee et al. |
| 2021/0151472 A1 | 5/2021 | Kang et al. |
| 2021/0202810 A1 | 7/2021 | Jung et al. |
| 2021/0391308 A1* | 12/2021 | Sim ........................ H01L 33/18 |
| 2022/0181522 A1 | 6/2022 | Moon et al. |

FOREIGN PATENT DOCUMENTS

| | | |
|---|---|---|
| KR | 10-2020-0121956 | 10/2020 |
| KR | 10-2021-0059107 | 5/2021 |
| KR | 10-2021-0077086 | 6/2021 |

OTHER PUBLICATIONS

Yun Jae Eo et al,. "Enhanced DC-Operated Electroluminescence of Forwardly Aligned p/MQW/n InGaN Nanorod LEDs via DC Offset-AC Dielectrophoresis", ACS Applied Materials & Interfaces, Oct. 11, 2017, pp. 37912-37920, vol. 9.

International Search Report corresponding to International Application No. PCT/KR2022/009342 dated Oct. 7, 2022.

* cited by examiner

DISPLAY DEVICE INCLUDING ELECTRIC FIELD FORMING AUXILIARY ELECTRODE AND METHOD OF MANUFACTURING THE SAME

CROSS-REFERENCE TO RELATED APPLICATION(S)

This application claims priority to and benefits of Korean Patent Application No. 10-2021-0089268 under 35 U.S.C. § 119, filed on Jul. 7, 2021 in the Korean Intellectual Property Office, the entire contents of which are incorporated herein by reference.

BACKGROUND

1. Technical Field

The disclosure relates to a display device and a method of manufacturing the same.

2. Description of the Related Art

In recent years, as interest in information display is increasing, research and development for a display device is continuously being conducted.

SUMMARY

An aspect of the disclosure is to provide a display device and manufacturing method in which a process cost may be reduced and an alignment degree of a light emitting element may be improved so as to improve light emitting efficiency.

Aspects of the disclosure are not limited to the above-described aspect, and other technical aspects which are not described will be clearly understood by those skilled in the art from the following description.

According to an embodiment of the disclosure, a display device may include a first electrode and a second electrode that are disposed on a substrate and spaced apart from each other, a light emitting element disposed between the first electrode and the second electrode, and an auxiliary electrode disposed on the substrate and overlapping the light emitting element such that the auxiliary electrode forms an electric field in an area where the light emitting element may be disposed.

According to an embodiment, the display device may further include a power line that provides power to the light emitting element through the second electrode, and a protective layer overlapping the power line, wherein the auxiliary electrode and the power line may be disposed on a same layer.

According to an embodiment, the display device may further include a transistor electrically connected to the light emitting element, the transistor including a first transistor electrode, a second transistor electrode, and a gate electrode, wherein the auxiliary electrode and the gate electrode may be disposed on a same layer.

According to an embodiment, the display device may further include a transistor electrically connected to the light emitting element, the transistor including a first transistor electrode, a second transistor electrode, and a gate electrode, and a lower electrode layer disposed on the substrate and having at least a portion overlapping the transistor. The auxiliary electrode and the lower electrode layer may be disposed on a same layer.

According to an embodiment, the display device may further include a power supply line that supplies power to the auxiliary electrode, the power supply line and the auxiliary electrode being disposed on different layers.

According to an embodiment, the auxiliary electrode may include a reflective material such that the auxiliary electrode reflects light emitted from the light emitting element.

According to an embodiment, the auxiliary electrode may include a first overlap area overlapping the first electrode, and a second overlap area overlapping the second electrode.

According to an embodiment, a separation distance between the auxiliary electrode and the first electrode may be about 2 µm or less in a thickness direction of the substrate.

According to an embodiment, the display device may further include a first contact electrode electrically connecting the first electrode and the light emitting element, and a second contact electrode electrically connecting the second electrode and the light emitting element. A portion of the auxiliary electrode may overlap the first electrode and the first contact electrode, and at least another portion of the auxiliary electrode may overlap the second electrode and the second contact electrode.

According to an embodiment, the first electrode and the second electrode may be spaced apart in a first direction, and the auxiliary electrode may extend in a second direction intersecting the first direction.

According to another embodiment of the disclosure, a method of manufacturing a display device may include providing a lifting electrode on a substrate, forming a protective layer on the lifting electrode, providing a first electrode and a second electrode on the protective layer, providing an ink including a light emitting element and a solvent on the substrate, performing a first alignment operation of positioning the light emitting element between the first electrode and the second electrode by providing an electrical signal to the first electrode and the second electrode, performing a second alignment operation of lifting the light emitting element by providing an electrical signal to the lifting electrode, and performing a third alignment operation of changing a position of the light emitting element by providing an electrical signal to the first electrode and the second electrode and positioning the light emitting element between the first electrode and the second electrode.

According to an embodiment, the method may further include forming a lifting power supply line on the substrate, and electrically connecting the lifting power supply line and the lifting electrode.

According to an embodiment, the method may further include forming a first bank and a second bank protruding in a thickness direction of the substrate on the protective layer thereby defining a space where a fluid may be accommodated.

According to an embodiment, the providing of the ink may include providing the ink between the first bank and the second bank.

According to an embodiment, the light emitting elements may be provided in plural, each light emitting element may include a first semiconductor layer that may be an N-type semiconductor, a second semiconductor layer that may be a P-type semiconductor, and an active layer disposed between the first semiconductor layer and the second semiconductor layer. After performing the first alignment operation, a portion of the light emitting element may be disposed so that the first semiconductor layer faces the first electrode, and another portion of the light emitting element may be disposed so that the first semiconductor layer faces the second electrode.

According to an embodiment, the method may further include forming an insulating layer overlapping the first electrode and the second electrode, wherein the performing of the first alignment operation may include contacting the insulating layer and the light emitting element each other.

According to an embodiment, the performing of the second alignment operation may include separating the light emitting element from the insulating layer so that a position of the light emitting element may be changed.

According to an embodiment, the performing of the second alignment operation may include preventing the light emitting element from contacting the insulating layer.

According to an embodiment, the performing of the third alignment operation may include bias-aligning the light emitting element.

According to an embodiment, the performing of the first alignment operation may include providing a first AC signal to the first electrode and the second electrode, and the performing of the second alignment operation may include providing a DC signal to the lifting electrode.

According to an embodiment, the performing of the third alignment operation may be performed after the second alignment operation may be performed, and the method may further include providing a second AC signal to the first electrode and the second electrode.

According to an embodiment, a frequency of the second AC signal may be greater than a frequency of the first AC signal.

According to an embodiment, a magnitude of the first AC signal may be greater than a magnitude of the second AC signal.

According to an embodiment, the performing of the third alignment operation may be performed after providing the second AC signal and may include providing a third AC signal to the first electrode and the second electrode.

According to an embodiment, a frequency of the third AC signal may be less than a frequency of the second AC signal.

According to an embodiment, the providing of the DC signal, the providing of the second AC signal, and the providing of the third AC signal may configure a single cycle, and the single cycle may be performed a plurality of times.

According to an embodiment, the providing of the second AC signal and providing the third AC signal may configure a single cycle, and the single cycle may be performed a plurality of times.

According to an embodiment, magnitudes of the second AC signal and the third AC signal may be less than about 10 Vpp.

According to still another embodiment of the disclosure, a method of manufacturing a display device may include providing a lifting electrode on a substrate, forming a protective layer on the lifting electrode, providing a first electrode and a second electrode on the protective layer, providing an ink including a light emitting element and a solvent on the substrate, performing a landing step of providing a first AC signal to the first electrode and the second electrode to position the light emitting element between the first electrode and the second electrode, performing a lifting step of providing a DC signal to the lifting electrode to separate the light emitting element from the first electrode and the second electrode, and performing a rotation step of changing a position of the light emitting element by providing a second AC signal and a third AC signal successively to the first electrode and the second electrode.

Solutions related to aspects of the disclosure are not limited to the above-described solutions, and solutions which are not described will be clearly understood by those skilled in the art from the specification and the accompanying drawings.

According to an embodiment of the disclosure, a display device and manufacturing method are provided in which a process cost may be reduced and alignment degree of a light emitting element may be improved to improve light emitting efficiency.

Effects of the disclosure are not limited to the above-described effects, and effects which are not described will be clearly understood by those skilled in the art from the specification and the accompanying drawings.

BRIEF DESCRIPTION OF THE DRAWINGS

The above and other features of the disclosure will become more apparent by describing in further detail embodiments thereof with reference to the accompanying drawings, in which.

DETAILED DESCRIPTION OF THE EMBODIMENTS

Figure 1:
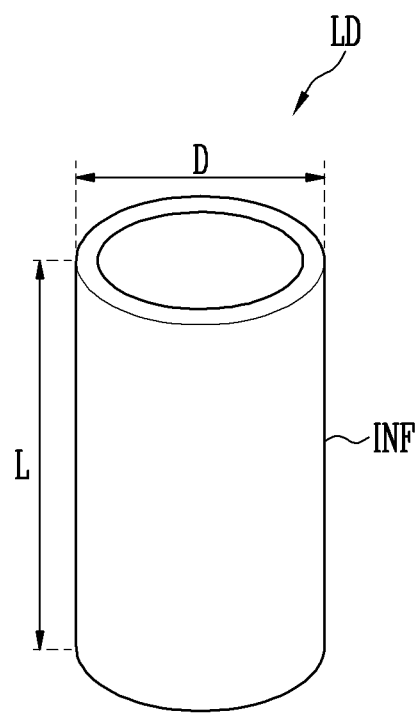
FIGS. 1 and 2 include a schematic perspective view and schematic cross-sectional view illustrating a light emitting element according to an embodiment.

Since the embodiments described in the specification are for clearly describing the spirit of the disclosure to those skilled in the art to which the disclosure pertains, the disclosure is not limited by the embodiments described in the specification, and the scope of the disclosure should be interpreted as including modifications or variations that do not depart from the spirit of the disclosure.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The drawings attached to the specification are intended to describe the disclosure. Since the shapes shown in the drawings may be exaggerated and displayed as necessary to help understanding of the disclosure, the disclosure is not limited by the drawings.

As used herein, the singular forms, "a," "an," and "the" are intended to include the plural forms as well (and vice versa), unless the context clearly indicates otherwise.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

In the specification, when it is determined that detailed description of a configuration or function related to the disclosure may obscure the subject matter of the disclosure, detailed description thereof will be omitted as necessary.

In the specification and the claims, the phrase "at least one of" is intended to include the meaning of "at least one selected from the group of" for the purpose of its meaning and interpretation. For example, "at least one of A and B" may be understood to mean "A, B, or A and B."

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

It will be understood that the terms "connected to" or "coupled to" may include a physical or electrical connection or coupling.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within f 30%, 20%, 10%, 5% of the stated value.

The disclosure relates to a display device and a method of manufacturing the same.

Hereinafter, a display device and a method of manufacturing the same according to an embodiment are described with reference to the accompanying drawings.

Figure 2:
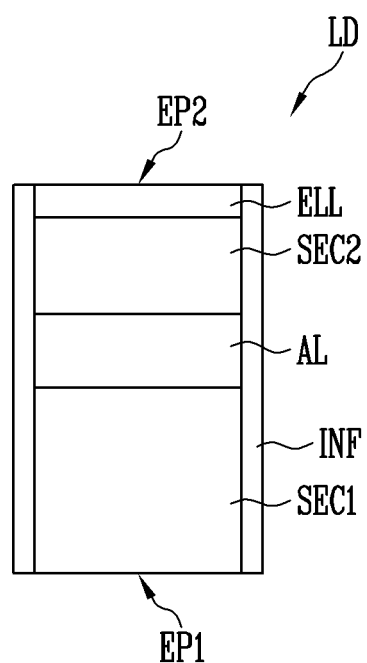

FIGS. 1 and 2 illustrate a light emitting element LD included in a display device according to an embodiment. FIGS. 1 and 2 include a schematic perspective view and schematic cross-sectional view illustrating a light emitting element according to an embodiment.

Referring to FIGS. 1 and 2, the light emitting element LD may include a first semiconductor layer SEC1 and a second semiconductor layer SEC2, and an active layer AL interposed between the first semiconductor layer SEC1 and the second semiconductor layer SEC2. The light emitting element LD may further include an electrode layer ELL. According to an embodiment, the first semiconductor layer SEC1, the active layer AL, the second semiconductor layer SEC2, and the electrode layer ELL may be sequentially stacked on each other along a length L direction of the light emitting element LD.

The light emitting element LD may have a first end portion EP1 and a second end portion EP2. The first semiconductor layer SEC1 may be adjacent to the first end portion EP1 of the light emitting element LD. The second semiconductor layer SEC2 and the electrode layer ELL may be adjacent to the second end portion EP2 of the light emitting element LD.

According to an embodiment, the light emitting element LD may have a pillar shape. The pillar shape may mean a shape extending in the length L direction, such as a cylinder or polygonal pillar. For example, a length L of the light emitting element LD may be greater than a diameter D (or a width of a cross-section). A shape of the cross-section of the light emitting element LD includes a rod-like shape and a bar-like shape, but the disclosure is not limited thereto.

The light emitting element LD may have a size of a nano (nanometer) scale to a micro (micrometer) scale. For example, each of the diameter D (or the width) and the length L of the light emitting element LD may have the size of the nano scale to the micro scale, but the disclosure is not limited thereto.

The first semiconductor layer SEC1 may be a semiconductor layer of a first conductivity type. For example, the first semiconductor layer SEC1 may include an N-type semiconductor layer. For example, the first semiconductor layer SEC1 may include a semiconductor material of at least one of InAlGaN, GaN, AlGaN, InGaN, AlN, and InN, and may include an N-type semiconductor layer doped with a first conductivity type dopant such as Si, Ge, and/or Sn. However, the material forming the first semiconductor layer SEC1 is not limited thereto, and other various materials may form the first semiconductor layer SEC1.

The active layer AL may be disposed on the first semiconductor layer SEC1. The active layer AL may be disposed between the first semiconductor layer SEC1 and the second semiconductor layer SEC2.

The active layer AL may include at least one of AlGaInP, AlGaP, AlInGaN, InGaN, and AlGaN. For example, in case that the active layer AL is intended to output red light, the active layer AL may include AlGaInP and/or InGaN. In case that the active layer AL is intended to output green light or blue light, the active layer AL may include InGaN. However, the active layer AL is not limited to the above-described example.

The active layer AL may be formed in a single-quantum well or multi-quantum well structure.

The second semiconductor layer SEC2 may be disposed on the active layer AL and may include a semiconductor layer of a type different from that of the first semiconductor layer SEC1. For example, the second semiconductor layer SEC2 may include a P-type semiconductor layer. For example, the second semiconductor layer SEC2 may include at least one semiconductor material among InAlGaN, GaN, AlGaN, InGaN, AlN, and InN, and may include a P-type semiconductor layer doped with a second conductivity type dopant such as Mg. However, the material forming the second semiconductor layer SEC2 is not limited thereto, and various other materials may form the second semiconductor layer SEC2.

The electrode layer ELL may be formed on the second semiconductor layer SEC2. The electrode layer ELL may include a metal or a metal oxide. According to an example, the electrode layer ELL may include at least one of Cr, Ti, Al, Au, Ni, ITO, IZO, ITZO, and an oxide or an alloy thereof.

In case that a voltage equal to or greater than a threshold voltage is applied to both ends of the light emitting element LD, the light emitting element LD may emit light while an electron-hole pair may be combined in the active layer AL. By controlling light emission of the light emitting element LD using this principle, the light emitting element LD may be used as a light source of various light emitting devices including a pixel of a display device (refer to 'DD' of FIG. 3).

The light emitting element LD may further include an insulating layer INF provided (or disposed) on a surface thereof. The insulating layer INF may be formed of a single layer or multiple layers.

The insulating layer INF may expose the both ends of the light emitting element LD having different polarities. For example, the insulating layer INF may expose a portion of each of the first semiconductor layer SEC1 disposed adjacent to the first end portion EP1 and the electrode layer ELL disposed adjacent to the second end portion EP2.

The insulating layer INF may include at least one insulating material among silicon oxide (SiOx), silicon nitride (SiNx), silicon oxynitride (SiOxNy), aluminum oxide (AlOx), and titanium oxide (TiOx). However, the insulating layer INF is not limited to a specific example.

The insulating layer INF may secure electrical stability of the light emitting element LD. Even in a case where light emitting elements LD are disposed close to each other, occurrence of an unwanted short between the light emitting elements LD may be prevented.

According to an embodiment, the light emitting element LD may further include an additional component in addition to the first semiconductor layer SEC1, the active layer AL, the second semiconductor layer SEC2, the electrode layer ELL, and the insulating layer INF. For example, the light emitting element LD may further include a phosphor layer, an active layer, a semiconductor layer, and/or an electrode layer.

Figure 3:
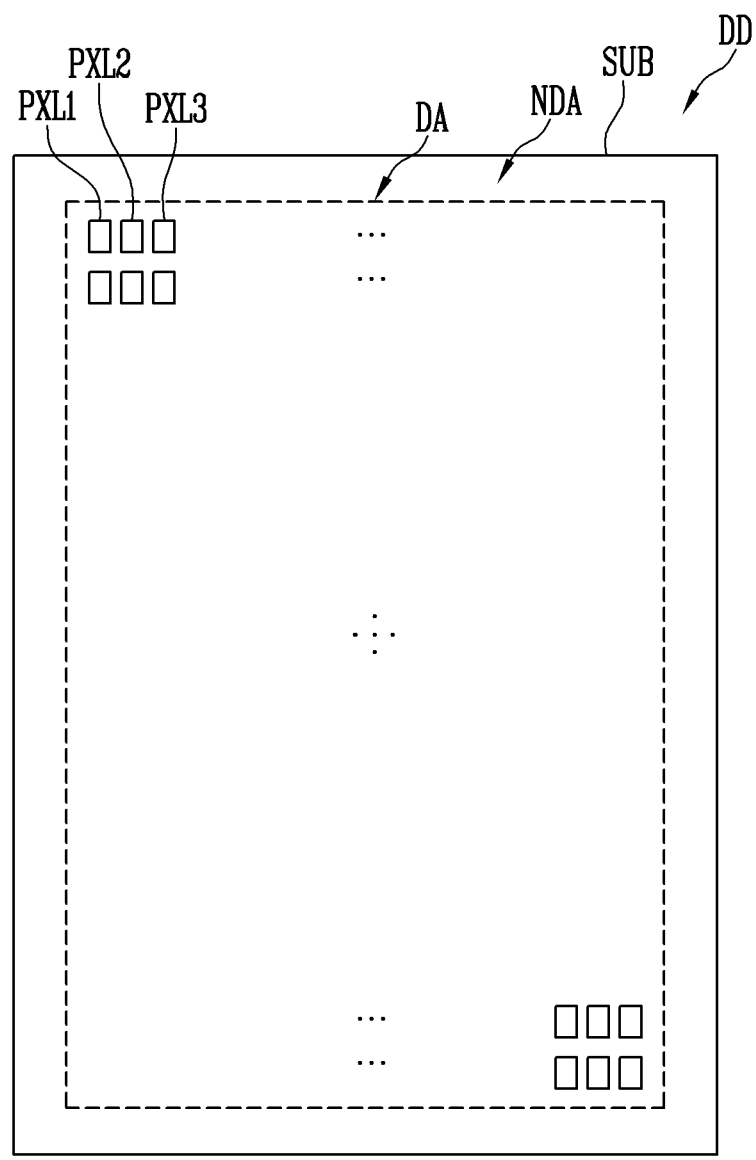
FIG. 3 is a schematic plan view schematically illustrating a display device according to an embodiment.

FIG. 3 is a schematic plan view schematically illustrating a display device according to an embodiment.

The display device DD may be configured to emit light. Referring to FIG. 3, the display device DD may include a substrate SUB and at least one pixel PXL disposed on the substrate SUB. Although not shown in the drawing, the display device DD may further include a driving circuit unit (for example, a scan driver and a data driver) for driving the pixel PXL, lines, and pads.

The display device DD may include a display area DA and a non-display area NDA. The non-display area NDA may mean an area other than the display area DA. The non-display area NDA may surround at least a portion of the display area DA.

The substrate SUB may configure a base member of the display device DD. The substrate SUB may be a rigid or flexible substrate or film, but is not limited to a specific example.

The display area DA may mean an area in which at least one pixel PXL may be disposed. The non-display area NDA may mean an area in which a pixel PXL may not be disposed. The non-display area NDA may include the driving circuit unit, the lines, and the pads electrically connected to the at least one pixel PXL of the display area DA.

According to an example, pixels PXL may be arranged according to a stripe or a PENTILE™ arrangement structure, but the disclosure is not limited thereto, and various embodiments may be applied.

According to an embodiment, a pixel PXL may include a first pixel PXL1, a second pixel PXL2, and a third pixel PXL3. Each of the first pixel PXL1, the second pixel PXL2, and the third pixel PXL3 may be a sub pixel. At least one of the first pixel PXL1, the second pixel PXL2, and the third pixel PXL3 may configure a pixel unit capable of emitting light of various colors.

For example, each of the first pixel PXL1, the second pixel PXL2, and the third pixel PXL3 may emit light of a color. For example, the first pixel PXL1 may be a red pixel emitting red light (for example, a first color), the second pixel PXL2 may be a green pixel emitting green light (for example, a second color), and the third pixel PXL3 may be a blue pixel emitting blue light (for example, a third color). However, the color, type, number, and/or the like of each of the first pixel PXL1, the second pixel PXL2, and the third pixel PXL3 configuring the pixel unit are/is not limited to a specific example.

Hereinafter, a structure of a pixel PXL according to an embodiment is described in more detail with reference to FIGS. 4 to 8.

Figure 4:
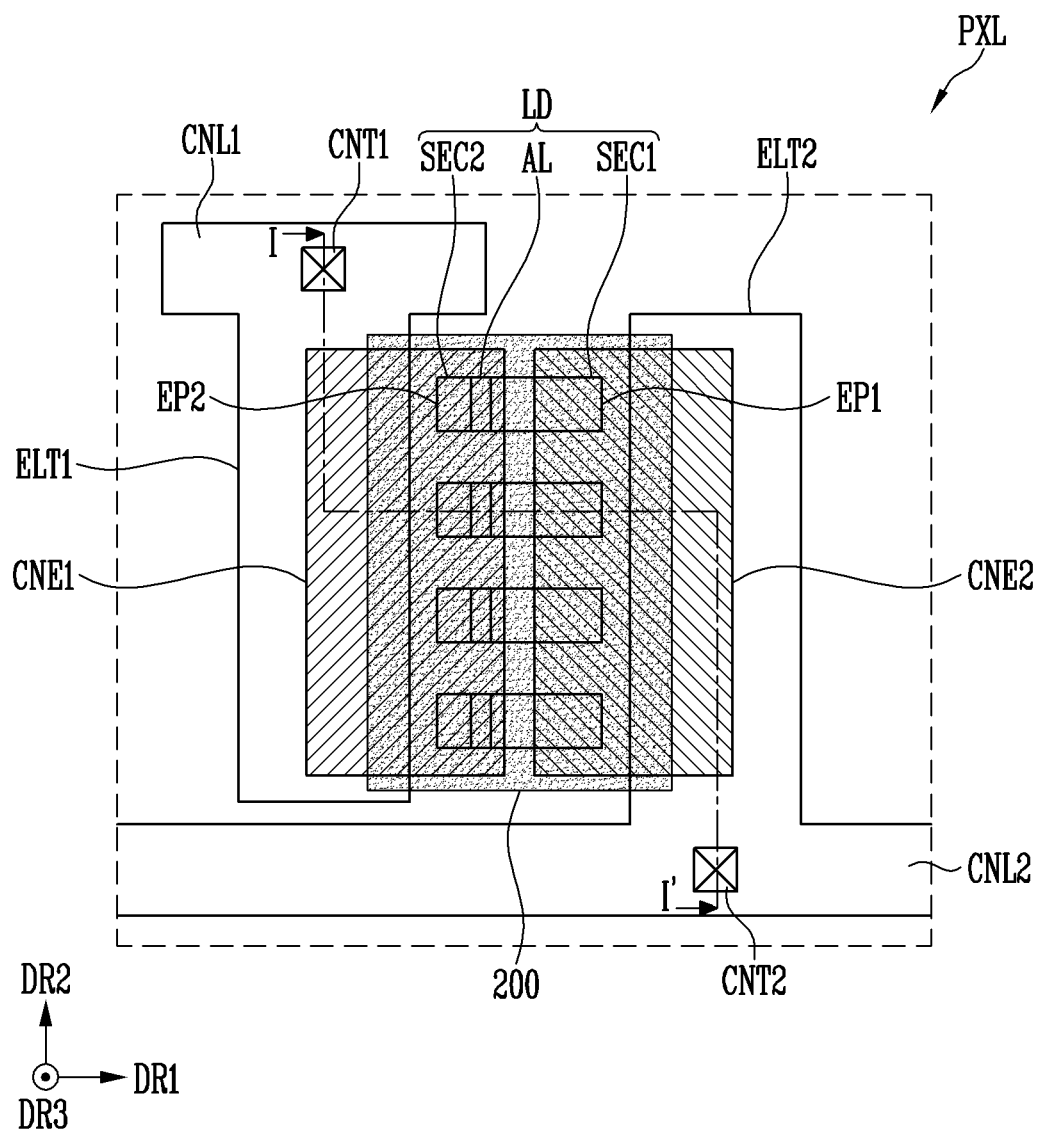
FIG. 4 is a schematic plan view illustrating a pixel according to an embodiment.

FIG. 4 is a schematic plan view illustrating a pixel according to an embodiment. The pixel PXL shown in FIG. 4 may be at least one of the first to third pixels PXL1, PXL2, and PXL3.

Referring to FIG. 4, the pixel PXL may include a first electrode ELT1, a second electrode ELT2, a first connection electrode CNL1, a second connection electrode CNL2, a first contact portion CNT1, a second contact portion CNT2, at least one light emitting element LD, a lifting electrode 200, a first contact electrode CNE1, and a second contact electrode CNE2.

Multiple light emitting elements LD may be provided and arranged. For example, the light emitting elements LD may be arranged in a parallel structure along a second direction DR2. However, an arrangement structure of the light emitting elements LD is not limited thereto.

The light emitting elements LD may be disposed between electrodes configured to function as alignment electrodes.

For example, the light emitting elements LD may be disposed between the first electrode ELT1 and the second electrode ELT2. The light emitting elements LD may be disposed on the first electrode ELT1 and the second electrode ELT2. At least a portion of the light emitting elements LD may be disposed between the first electrode ELT1 and the second electrode ELT2 in a plan view.

The light emitting elements LD may be electrically connected to the first electrode ELT1 through the first contact electrode CNE1.

According to an embodiment, the second end portion EP2 of a light emitting element LD may be electrically connected to the first contact electrode CNE1. Accordingly, the second semiconductor layer SEC2 of the light emitting element LD may be electrically connected to the first electrode ELT1 and the first contact electrode CNE1.

The light emitting element LD may be electrically connected to the second electrode ELT2 through the second contact electrode CNE2.

According to an embodiment, the first end portion EP1 of the light emitting element LD may be electrically connected to the second contact electrode CNE2. Accordingly, the first semiconductor layer SEC1 of the light emitting element LD may be electrically connected to the second electrode ELT2 and the second contact electrode CNE2.

The first electrode ELT1 may extend in the second direction DR2. The first electrode ELT1 may be spaced apart from the second electrode ELT2 in a first direction DR1. The first electrode ELT1 may be electrically connected to the first connection electrode CNL1. Here, the first direction DR1 may cross (or may not be parallel to) the second direction DR2.

The first connection electrode CNL1 may be electrically connected to a bridge pattern (refer to 'BRP' of FIG. 5) included in a pixel circuit part (refer to 'PCL' of FIG. 5) through the first contact portion CNT1. The first connection electrode CNL1 may be disposed on a same layer as the first electrode ELT1 and may be integrally formed with the first electrode ELT1.

The second electrode ELT2 may extend in the second direction DR2. The second electrode ELT2 may be spaced apart from the first electrode ELT1 in the first direction DR1. The second electrode ELT2 may be electrically connected to the second connection electrode CNL2.

The second connection electrode CNL2 may be electrically connected to a power line PL included in the pixel circuit part PCL through the second contact portion CNT2. The second connection electrode CNL2 may be disposed on a same layer as the second electrode ELT2 and may be integrally formed with the second electrode ELT2.

The lifting electrode 200 may overlap the light emitting elements LD in a plan view so as to form an electric field in an area where the light emitting elements LD may be disposed. According to an embodiment, the lifting electrode 200 may overlap the light emitting elements LD in a plan view.

According to an embodiment, the lifting electrode 200 may be referred to as an auxiliary electrode or a third electrode.

According to an embodiment, a portion of the lifting electrode 200 may overlap the first electrode ELT1 and the first contact electrode CNE1 in a plan view. Another portion of the lifting electrode 200 may overlap the second electrode ELT2 and the second contact electrode CNE2 in a plan view.

According to an embodiment, the lifting electrode 200 may have a shape extending in the second direction DR2. Here, the second direction DR2 may mean a direction that crosses (or may not be parallel) to the first direction DR1 in which the first electrode ELT1 and the second electrode ELT2 extend.

According to an embodiment, a slip area extending in the second direction DR2 may be defined between the first electrode ELT1 and the second electrode ELT2, and the lifting electrode 200 may overlap the slip area.

The first contact electrode CNE1 may be disposed on the first electrode ELT1 and may be electrically connected to the first electrode ELT1. The first contact electrode CNE1 may electrically connect the first electrode ELT1 and a light emitting element LD.

The second contact electrode CNE2 may be disposed on the second electrode ELT2 and may be electrically connected to the second electrode ELT2. The second contact electrode CNE2 may electrically connect the second electrode ELT2 and the light emitting element LD.

Hereinafter, a cross-sectional structure of a pixel PXL according to an embodiment is described with reference to FIGS. 5 to 8.

Figure 5:
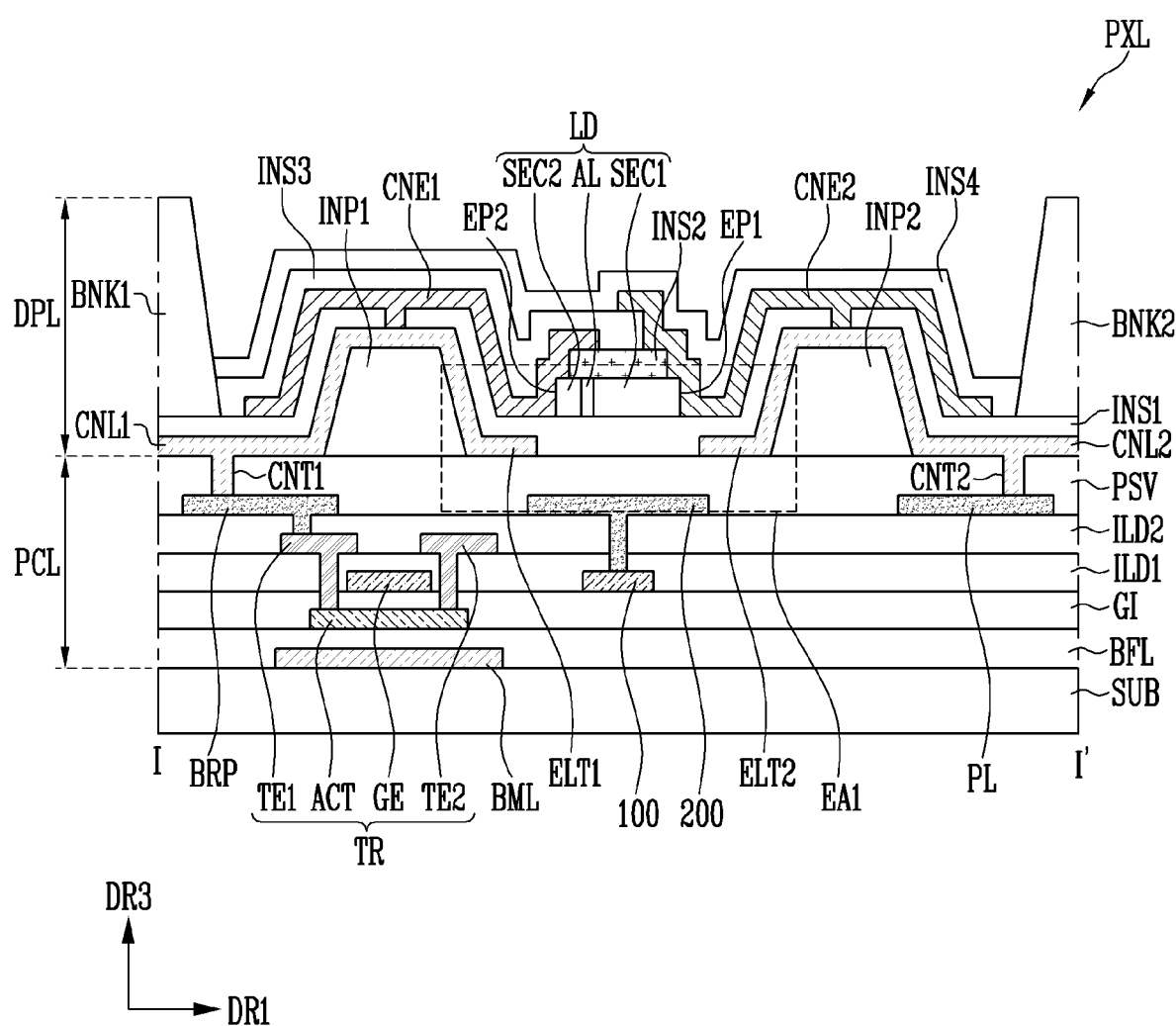
FIG. 5 is a schematic cross-sectional view taken along line I~I' of FIG. 4.
Figure 6:
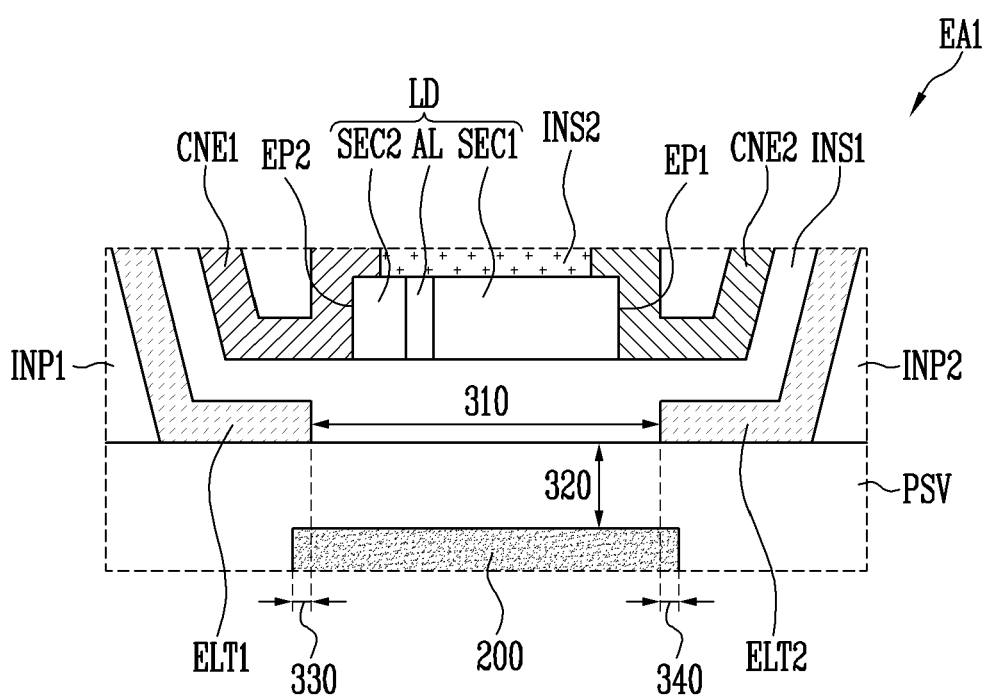
FIG. 6 is an enlarged schematic view of area EA1 of FIG. 5.
Figure 7:
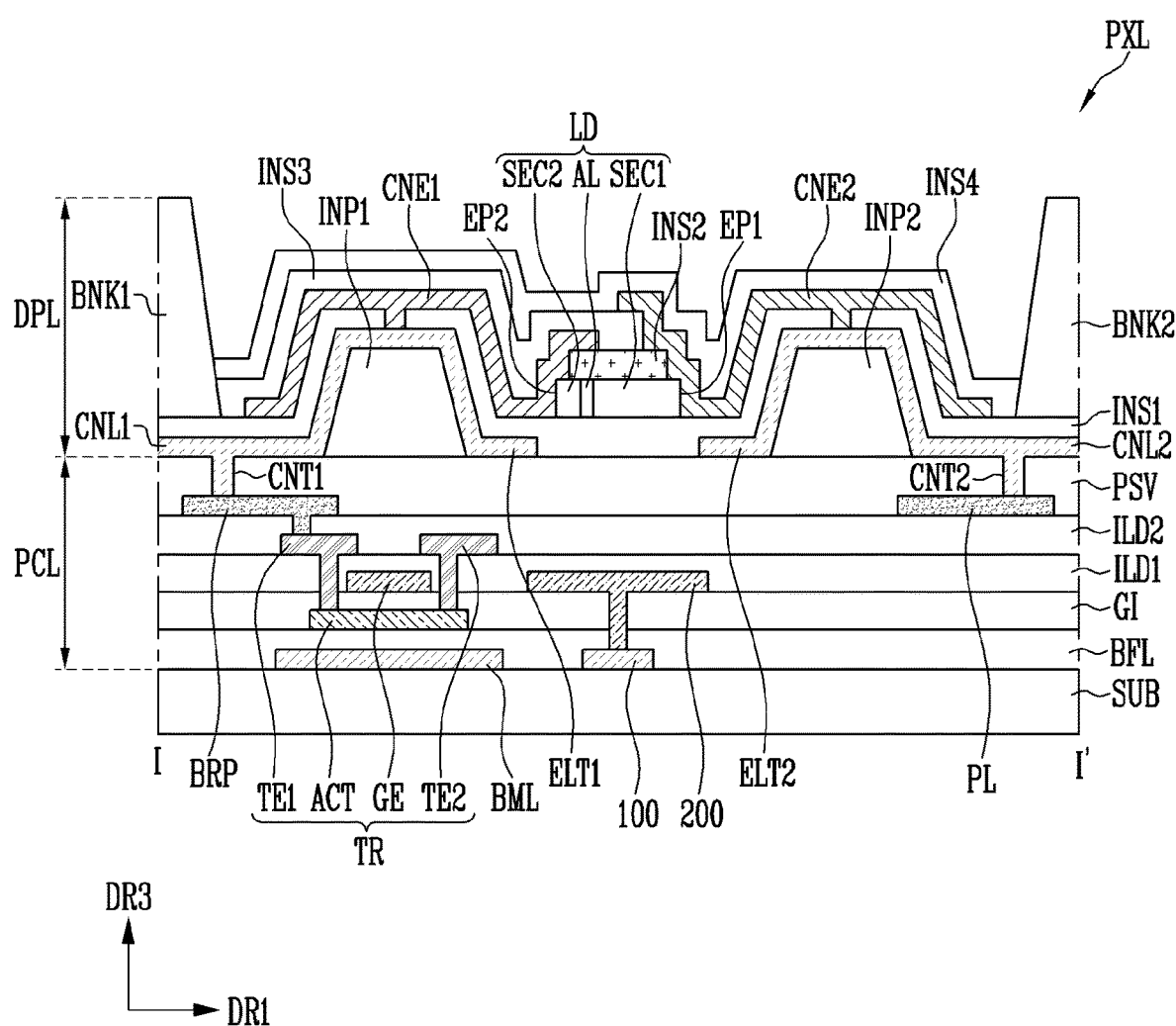
FIG. 7 is a schematic cross-sectional view illustrating a pixel according to another embodiment, and is a cross-sectional view illustrating a structure corresponding to a cross-sectional area taken along line I~I' of FIG. 4.
Figure 8:
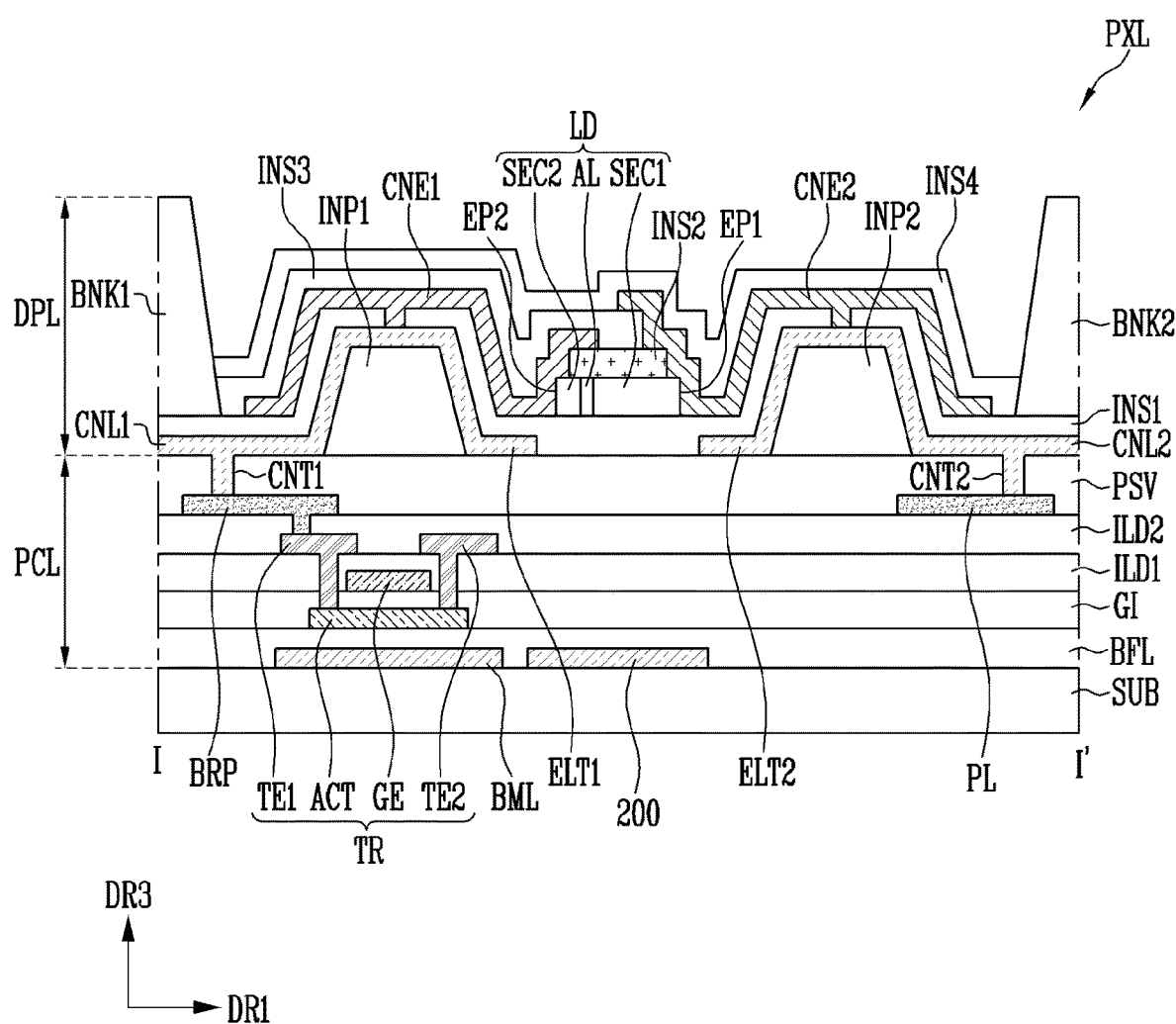
FIG. 8 is a schematic cross-sectional view illustrating a pixel according to another embodiment, and is a cross-sectional view illustrating a structure corresponding to the cross-sectional area taken along line I~I' of FIG. 4.

FIGS. 5 and 6 are schematic cross-sectional views illustrating a pixel PXL according to a first embodiment. FIG. 7 is a schematic cross-sectional view illustrating a pixel PXL according to another embodiment. FIG. 8 is a schematic cross-sectional view illustrating the pixel PXL according to another embodiment.

First, the pixel PXL according to an embodiment is described with reference to FIGS. 5 and 6. FIG. 5 is a cross-sectional view taken along line I~I' of FIG. 4. FIG. 6 is an enlarged view of EA1 area of FIG. 5.

Referring to FIG. 5, the pixel PXL may include the substrate SUB, the pixel circuit part PCL, and a display element part DPL.

The substrate SUB may configure a base member of the display device DD. The substrate SUB may be a rigid or flexible substrate or film, but is not limited to a specific example. The substrate SUB may be provided as a base surface, and the pixel circuit part PCL and the display element part DPL may be disposed on the substrate SUB.

The pixel circuit part PCL may be disposed on the substrate SUB. The pixel circuit part PCL may include a lower electrode layer (or a bottom metal layer) BML, a buffer layer BFL, a transistor TR, a gate insulating layer GI, a lifting power supply line 100, a first interlayer insulating layer ILD1, a second interlayer insulating layer ILD2, the bridge pattern BRP, a power line PL, the lifting electrode 200, a protective layer (or a passivation layer) PSV, the first contact portion CNT1, and the second contact portion CNT2.

The lower electrode layer BML may be disposed on the substrate SUB and covered by the buffer layer BFL. A portion of the lower electrode layer BML may overlap the transistor TR in a plan view.

According to an embodiment, the lower electrode layer BML may include a conductive material and function as a path through which an electrical signal provided to the pixel circuit part PCL and the display element part DPL moves. For example, the lower electrode layer BML may include at least one of aluminum (Al), copper (Cu), titanium (Ti), and molybdenum (Mo).

The buffer layer BFL may be disposed on the substrate SUB. The buffer layer BFL may prevent an impurity from diffusing from an outside. The buffer layer BFL may include at least one of a metal oxide such as silicon nitride (SiNx), silicon oxide (SiOx), silicon oxynitride (SiOxNy), and aluminum oxide (AlOx).

The transistor TR may be a thin film transistor. According to an embodiment, the transistor TR may be a driving transistor.

The transistor TR may be electrically connected to the light emitting element LD. The transistor TR may be electrically connected to the bridge pattern BRP. However, the transistor TR is not limited to the above-described example. According to an example, the transistor TR may be electrically connected to the first connection electrode CNL1 without passing through the bridge pattern BRP.

The transistor TR may include an active layer ACT, a first transistor electrode TE1, a second transistor electrode TE2, and a gate electrode GE.

The active layer ACT may refer to a semiconductor layer. The active layer ACT may be disposed on the buffer layer BFL. According to an example, the active layer ACT may include at least one of polysilicon, amorphous silicon, and an oxide semiconductor.

The active layer ACT may include a first contact region that may be in contact with the first transistor electrode TE1, and a second contact region that may be in contact with the second transistor electrode TE2. The first contact region and the second contact region may be semiconductor patterns doped with impurities. A region between the first contact region and the second contact region may be a channel region. The channel region may be an intrinsic semiconductor pattern that may not be doped with an impurity.

The gate electrode GE may be disposed on the gate insulating layer GI. A position of the gate electrode GE may correspond to a position of the channel region of the active layer ACT. For example, the gate electrode GE may be disposed on the channel region of the active layer ACT with the gate insulating layer GI interposed therebetween. According to an example, the gate electrode GE may include at least one of aluminum (Al), copper (Cu), titanium (Ti), and molybdenum (Mo).

The gate insulating layer GI may be disposed on the active layer ACT. The gate insulating layer GI may include an inorganic material. According to an example, the gate insulating layer GI may include at least one of silicon nitride (SiNx), silicon oxide (SiOx), silicon oxynitride (SiOxNy), and aluminum oxide (AlOx).

The first interlayer insulating layer ILD1 may be disposed on the gate electrode GE and the lifting power supply line 100. Similarly to the gate insulating layer GI, the first interlayer insulating layer ILD1 may include at least one of silicon nitride (SiNx), silicon oxide (SiOx), silicon oxynitride (SiOxNy), and aluminum oxide (AlOx).

The first transistor electrode TE1 and the second transistor electrode TE2 may be disposed on the first interlayer insulating layer ILD1. The first transistor electrode TE1 may pass through the gate insulating layer GI and the first interlayer insulating layer ILD1 to be in contact with the first contact region of the active layer ACT, and the second transistor electrode TE2 may pass through the gate insulating layer GI and the first interlayer insulating layer ILD1 to be in contact with the second contact region of the active layer ACT. According to an example, the first transistor electrode TE1 may be a drain electrode, and the second transistor electrode TE2 may be a source electrode, but embodiments are not limited thereto.

The lifting power supply line 100 may be disposed on the gate insulating layer GI. The lifting power supply line 100 may be covered by the first interlayer insulating layer ILD1.

According to an embodiment, the lifting power supply line 100 may overlap the lifting electrode 200 in a plan view. The lifting power supply line 100 may be disposed on a layer different from that of the lifting electrode 200. However, the disclosure is not limited thereto, and the lifting power supply line 100 may be disposed so as not to overlap the lifting electrode 200.

According to an embodiment, the lifting power supply line 100 may be disposed on a same layer as the gate electrode GE. For example, the lifting power supply line 100 may be formed (deposited, or provided) in a same process as the gate electrode GE. The lifting power supply line 100 may be patterned in a same process as the gate electrode GE, and may include a same material as the gate electrode GE.

However, a position of the lifting power supply line 100 is not limited to the above-described example. For example, the lifting power supply line 100 may be disposed on a same layer as the bridge pattern BRP, may be disposed on a same layer as the first transistor electrode TE1 and the second transistor electrode TE2, or may be disposed on a same layer as the lower electrode layer BML.

The lifting power supply line 100 may include a conductive material. For example, the lifting power supply line 100 may include at least one of aluminum (Al), copper (Cu), titanium (Ti), and molybdenum (Mo). However, the disclosure is not limited thereto.

According to an embodiment, the lifting power supply line 100 may provide an electrical signal to the lifting electrode 200. For example, the lifting power supply line 100 may be configured to supply power to the lifting electrode 200.

The second interlayer insulating layer ILD2 may be disposed on the first transistor electrode TE1 and the second transistor electrode TE2. Similarly to the first interlayer insulating layer ILD1 and the gate insulating layer GI, the second interlayer insulating layer ILD2 may include an inorganic material. The inorganic material may include at least one of the materials mentioned as possible configuration materials of the first interlayer insulating layer ILD1 and the gate insulating layer GI, for example, silicon nitride (SiNx), silicon oxide (SiOx), silicon oxynitride (SiOxNy), and aluminum oxide (AlOx).

The bridge pattern BRP may be disposed on the second interlayer insulating layer ILD2. The bridge pattern BRP may be electrically connected to the first transistor electrode TE1 through a contact hole passing through the second interlayer insulating layer ILD2. The bridge pattern BRP may be electrically connected to the first connection electrode CNL1 through the first contact portion CNT1 formed in the protective layer PSV.

The power line PL may be disposed on the second interlayer insulating layer ILD2. The power line PL may be electrically connected to the second connection electrode CNL2 through the second contact portion CNT2 formed in the protective layer PSV. The power line PL may provide power (or a cathode signal) to the light emitting element LD through the second electrode.

The lifting electrode 200 may be disposed on the second interlayer insulating layer ILD2. The lifting electrode 200 may be covered by the protective layer PSV. As described above, the lifting electrode 200 may overlap the light emitting element LD in a plan view.

According to an embodiment, the lifting electrode 200 may be disposed on a same layer as the bridge pattern BRP and the power line PL. For example, the lifting electrode 200 may be formed in a same process as the bridge pattern BRP and the power line PL. The lifting electrode 200 may be patterned in a same process as the bridge pattern BRP and the power line PL, and may include a same material. Accordingly, also in a case where the lifting electrode 200 is additionally provided, a separate additional process step may not be added. In particular, a separate mask may not be required, and finally, a process cost may be reduced.

The lifting electrode 200 may include a conductive material. For example, the lifting electrode 200 may include at least one of aluminum (Al), copper (Cu), titanium (Ti), and molybdenum (Mo). However, the disclosure is not limited thereto.

According to an embodiment, the lifting electrode 200 may include a material having an excellent reflective property so as to function as a reflective partition wall or bank for the light emitting element LD. For example, the lifting electrode 200 may include aluminum (Al) to improve reflectivity. The lifting electrode 200 may function as the reflective partition bank for the light emitting element LD, and thus light emitting efficiency of the light emitting element LD may be improved.

According to an embodiment, the lifting electrode 200 may be electrically connected to the lifting power supply line 100 through a through hole passing through the first interlayer insulating layer ILD1 and the second interlayer insulating layer ILD2. The lifting electrode 200 may receive the electrical signal from the lifting power supply line 100.

The protective layer PSV may be disposed on the second interlayer insulating layer ILD2. The protective layer PSV may cover the bridge pattern BRP, the power line PL, and the lifting electrode 200. The protective layer PSV may be a via layer.

According to an embodiment, the protective layer PSV may be provided in a form including an organic insulating layer, an inorganic insulating layer, or the organic insulating layer disposed on the inorganic insulating layer, but is not limited thereto.

According to an embodiment, the first contact portion CNT1 electrically connected to one region of the bridge pattern BRP and the second contact portion CNT2 electrically connected to one region of the power line PL may be formed on the protective layer PSV.

The display element part DPL may be disposed on the pixel circuit part PCL. The display element part DPL may include a first insulating pattern INP1, a second insulating pattern INP2, the first connection electrode CNL1, the second connection electrode CNL2, the first electrode ELT1, the second electrode ELT2, a first insulating layer INS1, the light emitting element LD, a second insulating layer INS2, the first contact electrode CNE1, the second contact electrode CNE2, and a third insulating layer INS3.

The first insulating pattern INP1 and the second insulating pattern INP2 may be disposed on the protective layer PSV. The first insulating pattern INP1 and the second insulating pattern INP2 may have a shape protruding in a display direction (for example, a third direction DR3) of the display device DD. According to an example, the first insulating pattern INP1 and the second insulating pattern INP2 may include an organic material or an inorganic material, but are not limited thereto.

The first connection electrode CNL1 and the second connection electrode CNL2 may be disposed on the protective layer PSV. The first connection electrode CNL1 may be electrically connected to the first electrode ELT1. The first connection electrode CNL1 may be electrically connected to the bridge pattern BRP through the first contact portion CNT1. The first connection electrode CNL1 may electrically connect the bridge pattern BRP and the first electrode ELT1. The second connection electrode CNL2 may be electrically connected to the second electrode ELT2. The second connection electrode CNL2 may be electrically connected to the power line PL through the second contact portion CNT2. The second connection electrode CNL2 may electrically connect the power line PL and the second electrode ELT2.

The first electrode ELT1 and the second electrode ELT2 may be disposed on the protective layer PSV. According to an embodiment, at least a portion of the first electrode ELT1 may be arranged on the first insulating pattern INP1, and at least a portion of the second electrode ELT2 may be arranged on the second insulating pattern INP2, so as to function as reflective partition banks, respectively.

The first electrode ELT1 may be electrically connected to the light emitting element LD. The first electrode ELT1 may be electrically connected to the first contact electrode CNE1 through a contact hole formed in the first insulating layer INS1. The first electrode ELT1 may provide an anode signal to the light emitting element LD.

The second electrode ELT2 may be electrically connected to the light emitting element LD. The second electrode ELT2 may be electrically connected to the second contact electrode CNE2 through a contact hole formed in the first insulating layer INS1. The second electrode ELT2 may apply a cathode signal (for example, a ground signal) to the light emitting element LD.

The first electrode ELT1 and the second electrode ELT2 may include a conductive material. For example, the first electrode ELT1 and the second electrode ELT2 may include at least one metal such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. However, the first electrode ELT1 and the second electrode ELT2 are not limited to the above-described example.

According to an embodiment, the first electrode ELT1 and the second electrode ELT2 may function as alignment electrodes for the light emitting elements LD. For example, the light emitting elements LD may be arranged based on the electrical signal provided from the first electrode ELT1 and the second electrode ELT2.

The first insulating layer INS1 may be disposed on the protective layer PSV. The first insulating layer INS1 may cover the first electrode ELT1 and the second electrode ELT2. The first insulating layer INS1 may stabilize a connection between electrode components and reduce an external influence. The first insulating layer INS1 may include at least one of silicon nitride (SiNx), silicon oxide (SiOx), silicon oxynitride (SiOxNy), and aluminum oxide (AlOx).

The light emitting element LD may be disposed on the first insulating layer INS1 to emit light based on an electrical signal provided from the first contact electrode CNE1 and the second contact electrode CNE2.

As described above with reference to FIGS. 1 and 2, the light emitting element LD may include the first end portion EP1 and the second end portion EP2.

According to an embodiment, the first end portion EP1 of the light emitting element LD may be disposed to face the second electrode ELT2 and the second contact electrode CNE2, and the second end portion EP2 of the light emitting element LD may be disposed to face the first electrode ELT1 and the first contact electrode CNE1.

Accordingly, the first semiconductor layer SEC1 of the light emitting element LD may be adjacent to the second electrode ELT2 and the second contact electrode CNE2, and the second semiconductor layer SEC2 of the light emitting element LD may be adjacent to the first electrode ELT1 and the first contact electrode CNE1.

The second insulating layer INS2 may be disposed on the light emitting element LD. The second insulating layer INS2 may cover the active layer AL of the light emitting element LD. According to an example, the second insulating layer INS2 may include at least one of an organic material and an inorganic material.

The first contact electrode CNE1 and the second contact electrode CNE2 may be disposed on the first insulating layer INS1. The first contact electrode CNE1 may electrically connect the first electrode ELT1 and the light emitting element LD, and the second contact electrode CNE2 may electrically connect the second electrode ELT2 and the light emitting element LD.

According to an embodiment, the first contact electrode CNE1 may provide the anode signal to the light emitting element LD, and the second contact electrode CNE2 may provide the cathode signal to the light emitting element LD.

The first contact electrode CNE1 and the second contact electrode CNE2 may include a conductive material. According to an example, the first contact electrode CNE1 and the second contact electrode CNE2 may include a transparent conductive material including at least one of indium tin oxide (ITO), indium zinc oxide (IZO), and indium tin zinc oxide (ITZO), but are not limited thereto.

The third insulating layer INS3 may be disposed on the first contact electrode CNE1. The third insulating layer INS3 may include at least one of the materials described with reference to the first insulating layer INS1. According to an embodiment, a portion of the third insulating layer INS3 may be disposed between the first contact electrode CNE1 and the second contact electrode CNE2 so that the first contact electrode CNE1 and the second contact electrode CNE2 may be prevented from being electrically shorted with each other.

A fourth insulating layer INS4 may be disposed on the first contact electrode CNE1, the second contact electrode CNE2, and the third insulating layer INS3. The fourth insulating layer INS4 may protect an individual configuration of the display element part DPL. According to an example, the fourth insulating layer INS4 may include at least one of silicon nitride (SiNx), silicon oxide (SiOx), silicon oxynitride (SiOxNy), and aluminum oxide (AlOx).

The structure of the pixel PXL is not limited to the example described above with reference to FIG. 5, and various deformable embodiments may be implemented.

For example, the pixel PXL may further include a planarization layer for offsetting a step difference of the individual configurations. According to an embodiment, a color conversion unit including a quantum dot configured to change a wavelength of light may be disposed on the display element part DPL, and according to an embodiment, a color filter that selectively transmits light having a wavelength may be further disposed.

Hereinafter, structures of the first electrode ELT1, the second electrode ELT2, the light emitting element LD, and the lifting electrode 200 in relation to the pixel PXL according to an embodiment are described with reference to FIG. 6.

Referring to FIG. 6, the lifting electrode 200 may be disposed under the light emitting element LD. The lifting electrode 200 may be disposed more adjacently to the substrate SUB as compared to the first electrode ELT1 and the second electrode ELT2.

According to an embodiment, the lifting electrode 200 may assist a process of arranging the light emitting elements LD. For example, the lifting electrode 200 may form an electric field that moves a light emitting element LD so that the light emitting element LD may be bias-aligned.

According to an embodiment, at least a portion of the lifting electrode 200 may be positioned between the first electrode ELT1 and the second electrode ELT2 in a plan view. According to an example, the electric field may be formed in the area where the light emitting element LD may be disposed, by applying an electrical signal of a high potential to the lifting electrode 200 and applying an electrical signal of a low potential to the first electrode ELT1 and the second electrode ELT2.

According to an embodiment, the first electrode ELT1 and the second electrode ELT2 may be spaced apart by a first distance 310. For example, the first electrode ELT1 and the second electrode ELT2 may be spaced apart by the first distance 310 in the first direction DR1. According to an example, the first distance 310 may be shorter than a length of the lifting electrode 200 in the first direction DR1. Accordingly, the lifting electrode 200 and the first electrode ELT1 may overlap each other in a plan view to form a first overlap area having a first overlap length 330. The lifting electrode 200 and the second electrode ELT2 may overlap each other in a plan view to form a second overlap area having a second overlap length 340.

According to an embodiment, the lifting electrode 200 may be configured to reflect the light emitted from the light emitting element LD. Accordingly, the lifting electrode 200 may function as a reflective plate (or reflective partition wall or bank) for the light emitting element LD.

At this time, the lifting electrode 200 may form the first overlap area and/or the second overlap area with the first electrode ELT1 and the second electrode ELT2, to more efficiently perform light reflection, and thus the light emitting efficiency may be further improved.

In order to efficiently form the electric field in the area where the light emitting element LD may be disposed, a position of the lifting electrode 200 may be disposed adjacent to the display element part DPL.

For example, the first electrode ELT1 and the second electrode ELT2 may be separated by the lifting electrode 200 and the protective layer PSV. At this time, an electrical signal provided from the lifting electrode 200 may be changed by a second distance 320, which means a distance between the lifting electrode 200 and the first electrode ELT1 (or the second electrode ELT2). In case that the second distance 320 is based on the thickness direction of the substrate SUB (or the display direction of the display device DD, for example, the third direction DR3), the second distance 320 may mean a separation distance between the lifting electrode 200 and the first electrodes ELT1 (or the second electrodes ELT2).

Experimentally, the electrical signal provided from the lifting electrode 200 may be changed according to a dielectric constant of the protective layer PSV covering the lifting electrode 200. Accordingly, the second distance 320 may be short to prevent distortion of the electrical signal. According to an embodiment, the second distance 320 may be about 2 μm or less, but is not limited thereto.

Hereinafter, a pixel PXL according to another embodiment is described with reference to FIG. 7. FIG. 7 is a schematic cross-sectional view illustrating the pixel according to another embodiment, and is a cross-sectional view illustrating a structure corresponding to a cross-sectional area taken along line I~I' of FIG. 4.

For convenience of description, the description of the content that may be repetitive to the above-described content may be simplified or omitted.

The pixel PXL according to another embodiment may be different from the pixel PXL according to the above embodiments at least in that the lifting electrode 200 may be disposed on a same layer as the gate electrode GE.

The lifting electrode 200 may be disposed on the gate insulating layer GI. The lifting electrode 200 may be covered by the first interlayer insulating layer ILD1.

The lifting electrode 200 may be electrically connected to the lifting power supply line 100 through a contact hole formed in the gate insulating layer GI. The lifting power supply line 100 may be disposed on a same layer as the lower electrode layer BML to provide an electrical signal to the lifting electrode 200.

According to an embodiment, the lifting electrode 200 may be formed on a same layer as the gate electrode GE, and may overlap the light emitting element LD in a plan view. Accordingly, similarly to above embodiments, the lifting electrode 200 may form an electric field in the area where the light emitting element LD may be disposed.

Hereinafter, a pixel PXL according to yet another embodiment is described with reference to FIG. 8. FIG. 8 is a cross-sectional view illustrating the pixel according to yet another embodiment, and is a cross-sectional view illustrating a structure corresponding to the cross-sectional area taken along line I~I' of FIG. 4.

For convenience of description, the description of the content that may be repetitive to the above-described content may be simplified or omitted.

A pixel PXL according to another embodiment may be different from the pixel PXL according to above embodiments at least in that the lifting electrode 200 may be disposed on a same layer as the lower electrode layer BML.

The lifting electrode 200 may be disposed on the substrate SUB. The lifting electrode 200 may be covered by the buffer layer BFL.

Although not shown in the drawing, the lifting electrode 200 may receive an electrical signal through another line (for example, the lower electrode layer BML disposed in a different area).

According to an embodiment, the lifting electrode 200 may be formed on a same layer as the lower electrode layer BML, and may overlap the light emitting element LD in a plan view. Accordingly, similarly to above embodiments, the lifting electrode 200 may form the electric field in the area where the light emitting element LD may be disposed.

Hereinafter, a method of manufacturing the display device DD according to an embodiment is described with reference to FIGS. 9 to 21. In particular, for convenience of description, the disclosure is described based on first described embodiments (FIGS. 5 and 6) among the above-described contents.

Figure 9:
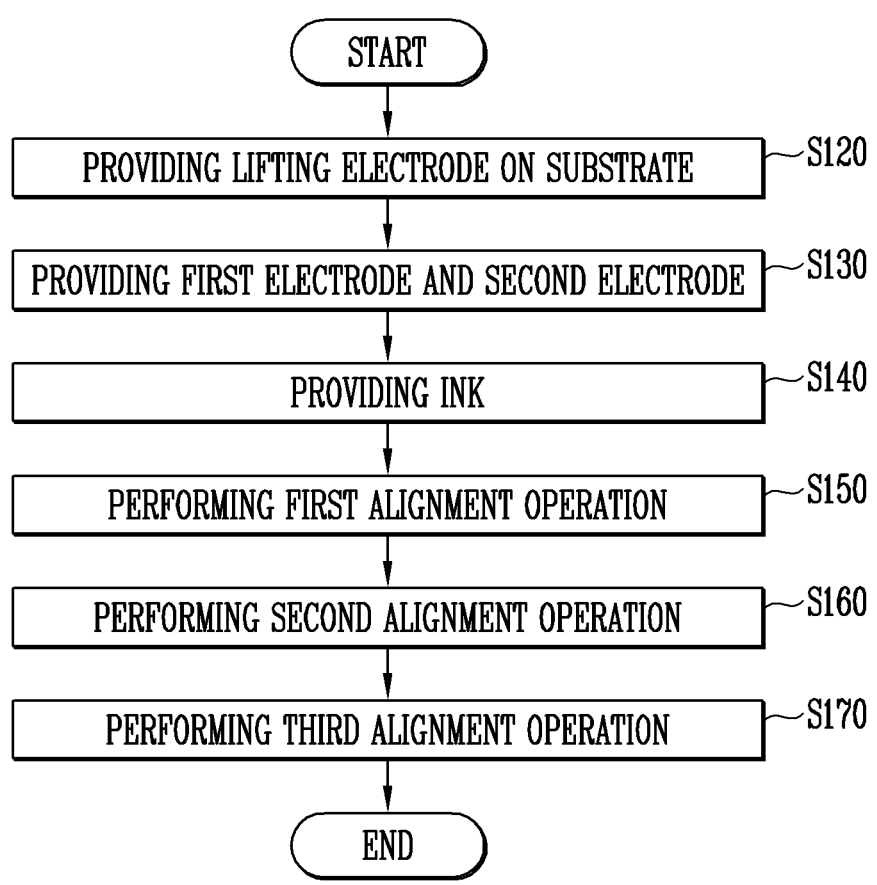
FIG. 9 is a schematic flowchart illustrating a method of manufacturing a display device according to an embodiment.

FIG. 9 is a schematic flowchart illustrating a method of manufacturing a display device according to an embodiment.

Figure 10:
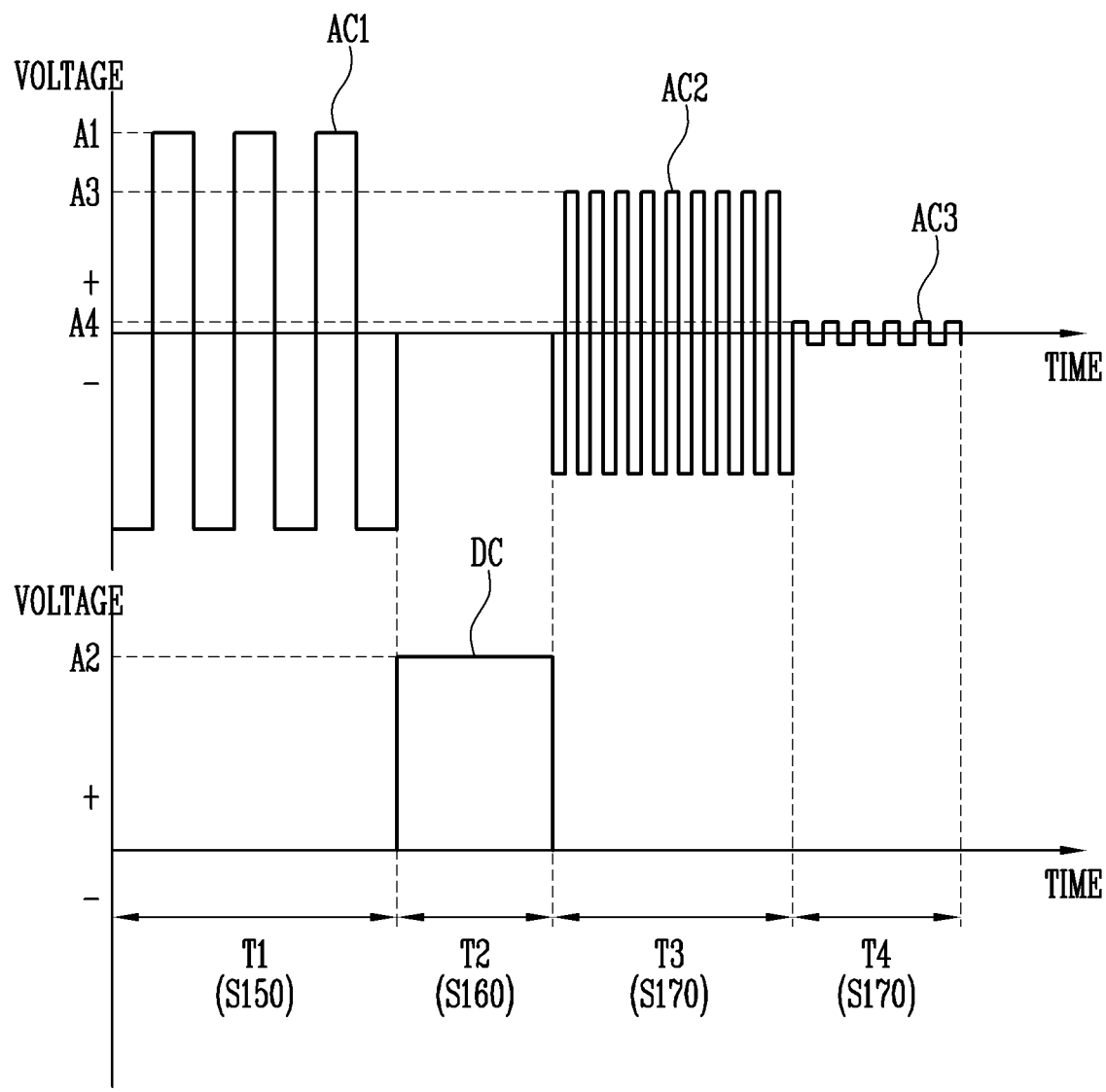
FIG. 10 is a schematic graph illustrating an intensity of an electrical signal provided in case that an alignment operation of a light emitting element is performed.

FIG. 10 is a schematic graph illustrating an intensity of an electrical signal provided in case that an alignment operation of a light emitting element is performed. FIG. 10 is a graph illustrating the intensity of the electrical signal provided in case that steps S150, S160, and S170 performing first to third alignment operations of FIG. 9 are performed.

FIGS. 11, 12, 14, 16, 18, 20, and 21 are schematic cross-sectional views of a method of manufacturing a display device according to an embodiment for each process step. FIGS. 11, 12, 14, 16, 18, 20, and 21 show the structure corresponding to the cross-sectional area taken along line I~I' of FIG. 4. However, the layers disposed between the protective layer PSV and the substrate SUB in the pixel circuit part PCL are comprehensively denoted as a lower layer 300 so that the drawing may be clearly shown.

FIGS. 13, 15, 17, and 19 are schematic plan views of a method of manufacturing a display device according to an embodiment for each process step. FIGS. 13, 15, 17, and 19 show a position corresponding to an area of the pixel PXL described above with reference to FIG. 4.

FIGS. 13 and 14, FIGS. 15 and 16, and FIGS. 17 and 18 are views showing a same time point during a process progression.

Referring to FIG. 9, the method of manufacturing the display device DD according to an embodiment may include providing the lifting electrode on the substrate (S120), providing the first electrode and the second electrode (S130), providing an ink (S140), performing the first alignment operation (S150), performing the second alignment operation (S160), and performing the third alignment operation (S170).

Figure 11:
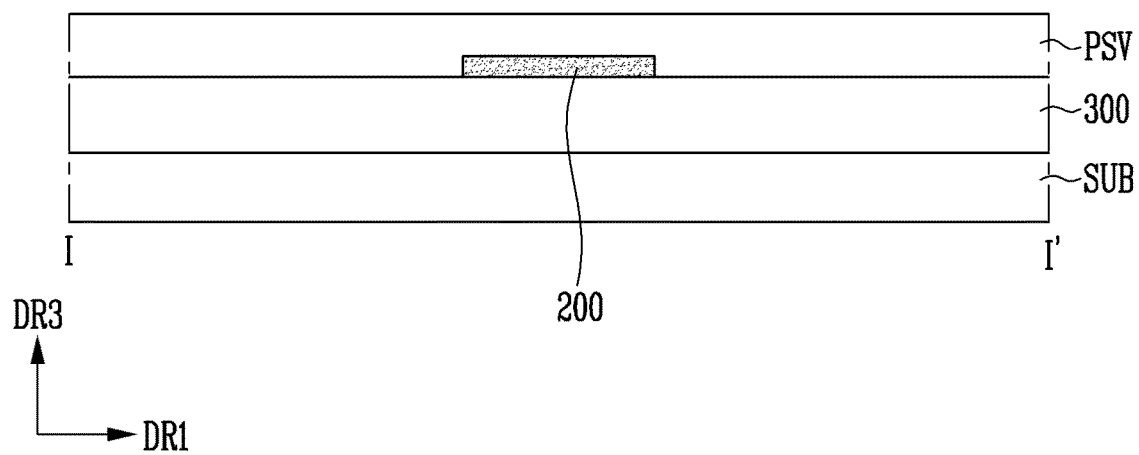
FIGS. 11, 12, 14, 16, 18, 20, and 21 are schematic cross-sectional views of a method of manufacturing a display device according to an embodiment for each process step.

Referring to FIGS. 9 and 11, in the step of providing the lifting electrode 200 on the substrate SUB (S120), the substrate SUB may be provided and the lower layer 300 may be disposed on the substrate SUB. Thereafter, the lifting electrode 200 may be disposed on the lower layer 300. The protective layer PSV may be formed to cover the lifting electrode 200.

In the step, individual configurations (for example, the configurations included in the pixel circuit part PCL) of the lower layer 300 disposed on the substrate SUB may be formed by patterning a conductive layer (or a metal layer), an inorganic material, an organic material, or the like by performing a process using a mask.

In the step, the lifting electrode 200 may be formed on the lower layer 300 and the protective layer PSV may be applied to be electrically separated from another line.

In the step, the lifting electrode 200 may be formed so as to overlap the area where the light emitting element LD is to be provided.

In the step, although not shown in a separate drawing, the lifting electrode 200 may be electrically connected to another line. For example, as described above with reference to FIG. 5, the lifting electrode 200 may be a conductive layer included in the lower layer 300, and may be electrically connected to the lifting power supply line 100.

According to an embodiment, the lifting electrode 200 may be disposed on a same layer as the gate electrode GE or the lower electrode layer BML disposed on the lower layer 300, and thus the structure of the pixel PXL according to another embodiment (FIG. 7) or yet another embodiment (FIG. 8) may be provided.

Figure 12:
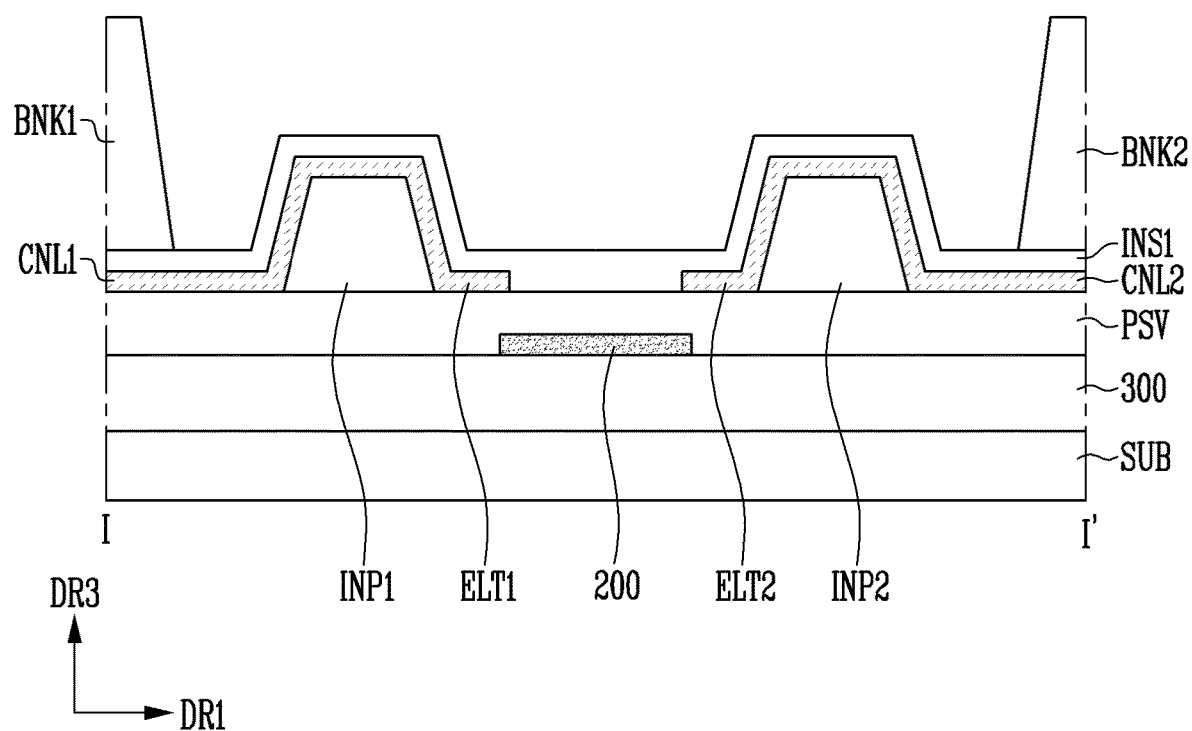

Referring to FIGS. 9 and 12, in the step of providing the first electrode ELT1 and the second electrode ELT2 (S130), the first insulating pattern INP1 and the second insulating pattern INP2 may be formed, and the first electrode ELT1, the second electrode ELT2, the first connection electrode CNL1, and the second connection electrode CNL2 may be formed (or deposited). The first insulating layer INS1 may be formed on the first electrode ELT1, the second electrode ELT2, the first connection electrode CNL1, and the second connection electrode CNL2, and a first bank BNK1 and a second bank BNK2 may be formed on the first insulating layer INS1.

In the step, although not shown in a separate drawing, after depositing a base electrode on the protective layer PSV, at least a portion of the base electrode may be etched to provide the first connection electrode CNL1, the second connection electrode CNL2, the first electrode ELT1, and the second electrode ELT2.

In the step, each of the first electrode ELT1 and the second electrode ELT2 may be formed to cover the first insulating pattern INP1 and the second insulating pattern INP2. Accordingly, in the step, at least a portion of the first electrode ELT1 and the second electrode ELT2 may be provided as a reflective partition bank.

In the step, the first electrode ELT1 and the second electrode ELT2 may be disposed on the lifting electrode 200. Accordingly, in a plan view, the lifting electrode 200 may be provided to be disposed between the first electrode ELT1 and the second electrode ELT2.

According to an embodiment, a space in which a fluid may be accommodated may be defined between the first bank BNK1 and the second bank BNK2. For example, the first bank BNK1 and the second bank BNK2 may protrude in the thickness direction of the substrate SUB to form the space in which the fluid may be accommodated.

Figure 13:
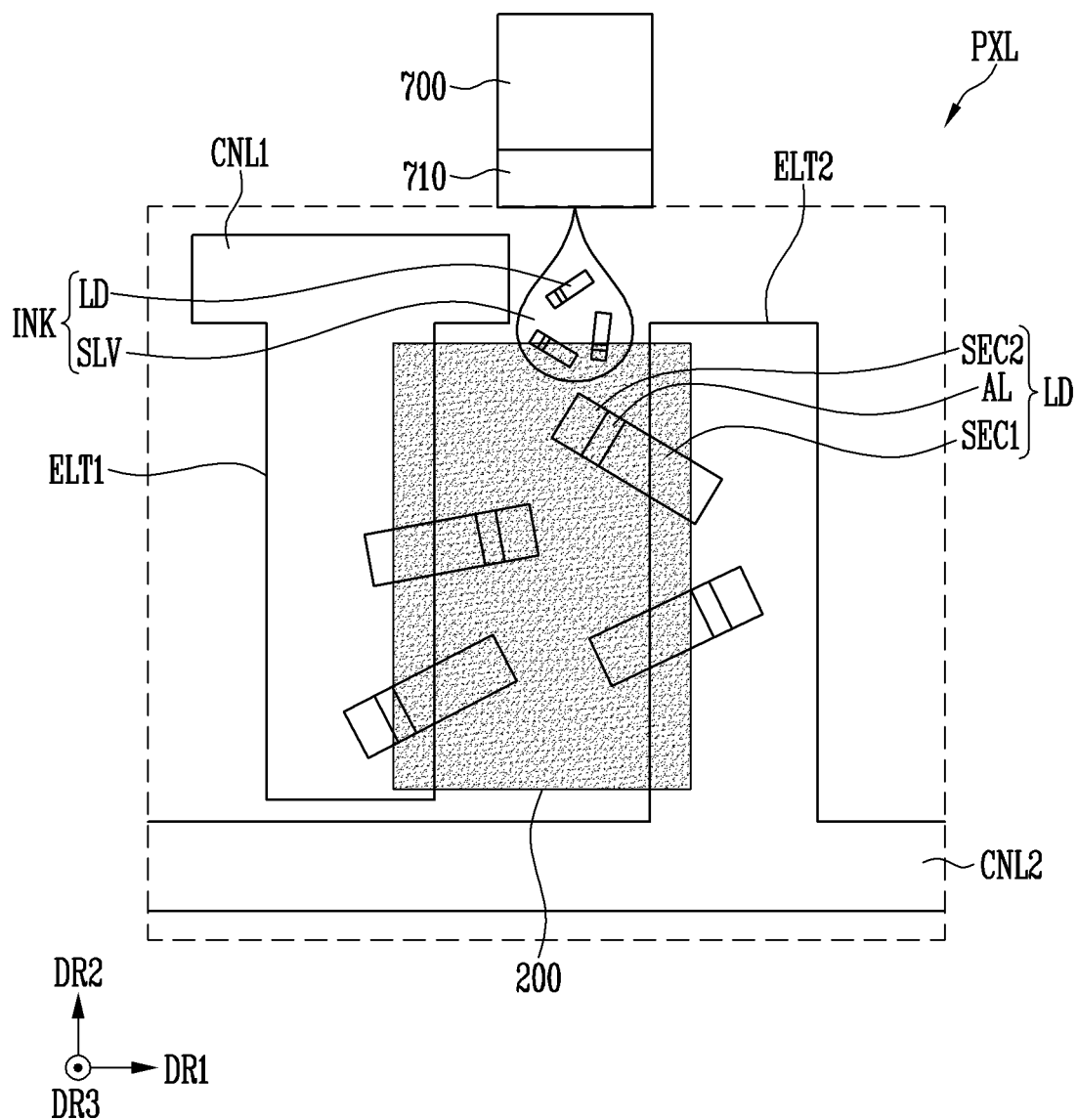
FIGS. 13, 15, 17, and 19 are schematic plan views of a method of manufacturing a display device according to an embodiment for each process step.
Figure 14:
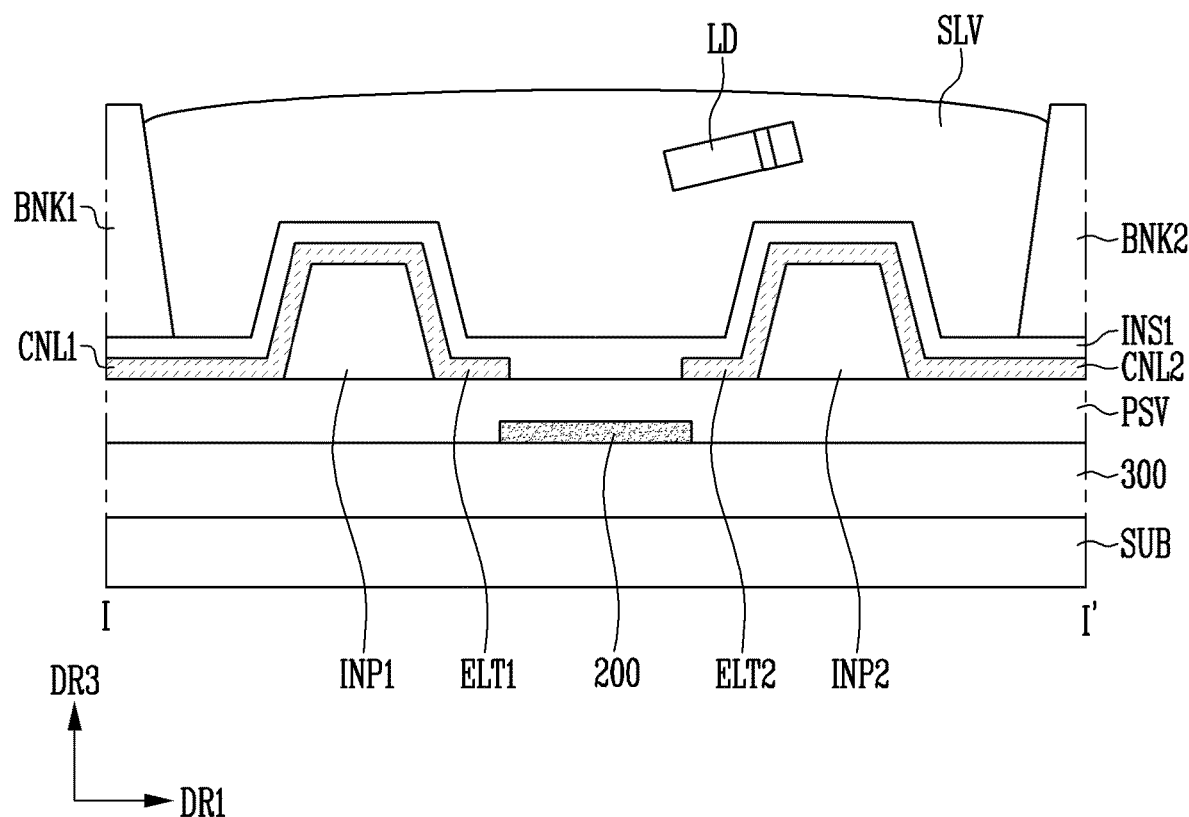

Referring to FIGS. 9, 13, and 14, in the step of providing the ink INK (S140), the ink INK may be sprayed onto the substrate SUB. The ink INK may be provided by a printing device 700 configured to spray a fluid.

According to an embodiment, the printing device 700 may include a nozzle unit 710 configured to discharge a liquid fluid to an outside. The ink INK defined in the specification may mean a liquid mixture that may be discharged by the printing device 700.

In the step, the printing device 700 may spray the ink INK to the area where the light emitting element LD is to be arranged, while moving along the second direction DR2.

According to an embodiment, the ink INK may include a solvent SLV and the light emitting element LD. Multiple light emitting elements LD may be provided, and may be dispersedly provided in the solvent SLV having a fluid property. According to an example, the solvent SLV may mean a material other than a solid phase, which allows the light emitting element LD to be dispersedly prepared.

In the step, the ink INK may be accommodated in the area defined by the first bank BNK1 and the second bank BNK2. (Refer to FIG. 14) The first bank BNK1 and the second bank BNK2 may protrude in the display direction of the display device DD (for example, the third direction DR3) to define the space in which the fluid may be accommodated.

In the step, the ink INK may be accommodated in the space, and the light emitting elements LD may be provided in a state in which the light emitting elements LD are randomly positioned in the area in the first bank BNK1 and the second bank BNK2.

Figure 15:
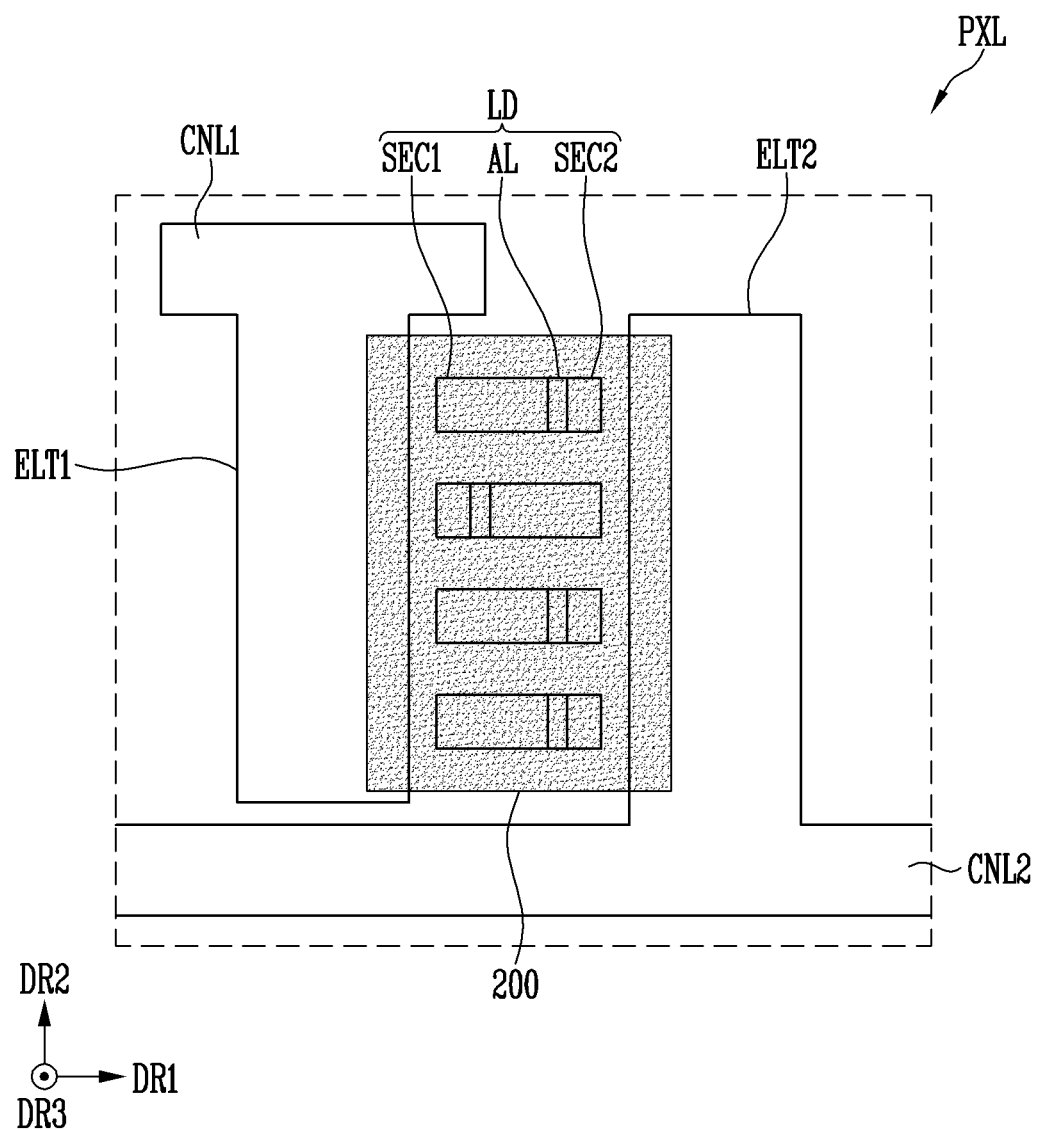
Figure 16:
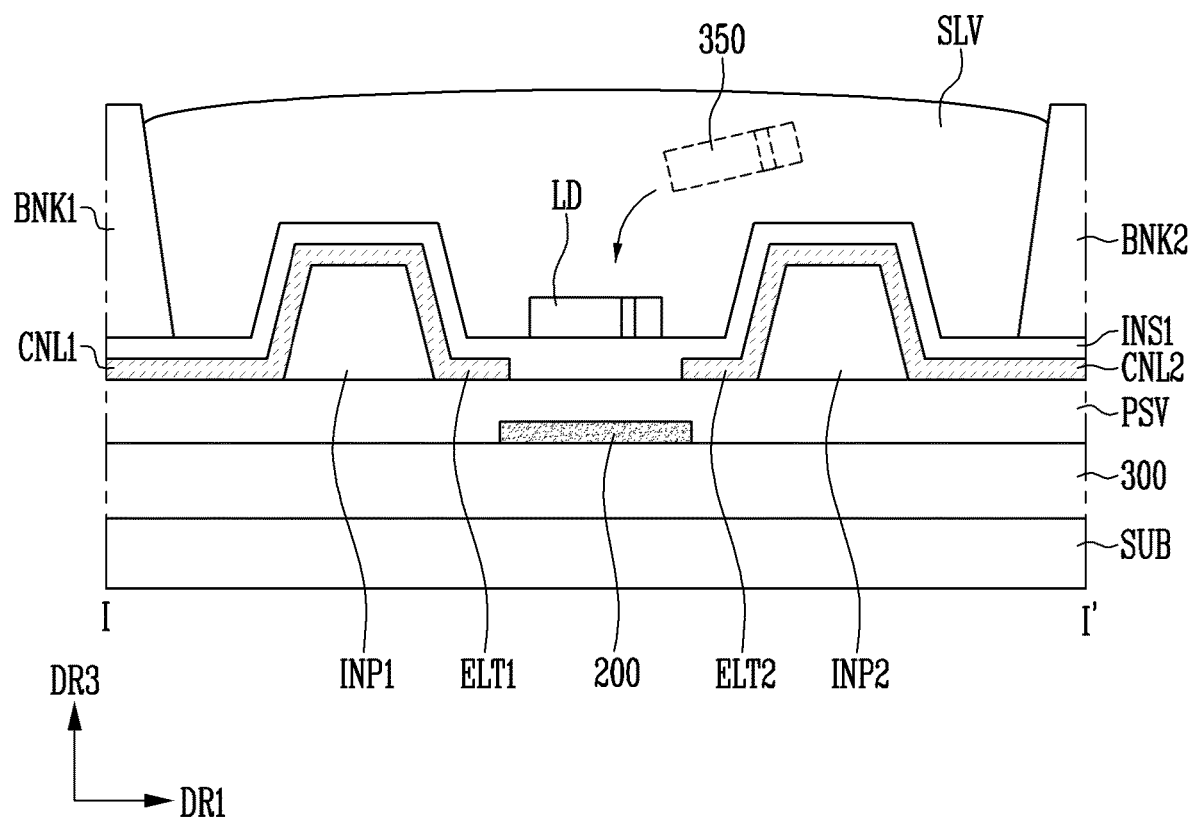

Referring to FIGS. 9, 15, and 16, in the step of performing the first alignment operation (S150), the light emitting element LD may be arranged at a position between the first electrode ELT1 and the second electrode ELT2. The step (the first alignment operation) may be referred to as a landing step.

In the step, the light emitting elements LD may be positioned in a slip area defined by an area between the first electrode ELT1 and the second electrode ELT2 spaced apart from each other at a randomly arranged position 350.

In the step, the light emitting element LD may be moved to the slip area by a DEP force (dielectrophoresis) generated based on the electrical signals provided to the first electrode ELT1 and the second electrode ELT2.

In the step, the light emitting element LD may be provided adjacent to the first electrode ELT1 and the second electrode ELT2. According to an embodiment, an end of the light emitting element LD may be adjacent to the first electrode ELT1 and may be in contact with the first insulating layer INS1, and another end of the light emitting element LD may be adjacent to the second electrode ELT2 and may be in contact with the first insulating layer INS1.

However, in the step, the light emitting element LD may be arranged between the first electrode ELT1 and the second electrode ELT2, and a polarity direction of the light emitting element LD may be randomly selected.

In order to operate the light emitting element LD later, the anode signal may be provided through the first electrode ELT1 and the cathode signal may be provided through the second electrode ELT2. In order to normally operate the light emitting element LD, the first semiconductor layer SEC1 of a light emitting element LD may be required to face the second electrode ELT2, and the second semiconductor layer SEC2 may be required to face the first electrode ELT1.

However, in the step, the polarity direction of the light emitting elements LD may be randomly selected, and some of the light emitting elements LD may be arranged in an abnormal direction.

In FIG. 15, three light emitting elements LD may be disposed so that the first semiconductor layer SEC1 faces the first electrode ELT1 and the second semiconductor layer SEC2 faces the second electrode ELT2, and one light emitting element LD may be disposed so that the first semiconductor layer SEC1 faces the second electrode ELT2 and the second semiconductor layer SEC2 faces the first electrode ELT1. Accordingly, one or more of the light emitting elements LD may be disposed to have difficulty in normal operation, and thus the position of some of the light emitting elements LD may be required to be changed.

Referring to FIG. 10 in relation to the step, in the step of performing the first alignment operation (S150), a first AC signal AC1 may be provided to the first electrode ELT1 and the second electrode ELT2. The first AC signal AC1 may be applied to the first electrode ELT1 and the second electrode ELT2 to form an electric field in an adjacent area.

Here, the first AC signal AC1 may be a signal provided within a first time period T1 in which the first alignment operation may be performed, and may be for positioning the light emitting element LD in an area between the first electrode ELT1 and the second electrode ELT2. For example, the first AC signal AC1 may be for providing the DEP force acting as an external force to the light emitting element LD.

According to an embodiment, the first AC signal AC1 may be any one or more of a sine wave, a triangular wave, a staircase wave, a square wave, a trapezoidal wave, and a pulse wave, but is not limited thereto, and may have various AC signal types.

According to an embodiment, the first AC signal AC1 may have a magnitude and a frequency suitable for moving the light emitting element LD to the slip area within the first time period T1. The first AC signal AC1 may be provided with a first magnitude A1 and a first frequency. Here, the first magnitude A1 may be provided to be greater than a third magnitude A3 of a second AC signal AC2 and a fourth magnitude A4 of the third AC signal AC3 provided in case that the third alignment operation may be subsequently performed. The first frequency may be provided at a level suitable for applying the DEP force to the light emitting element LD. For example, the first frequency may be less than a second frequency of the second AC signal AC2.

Figure 17:
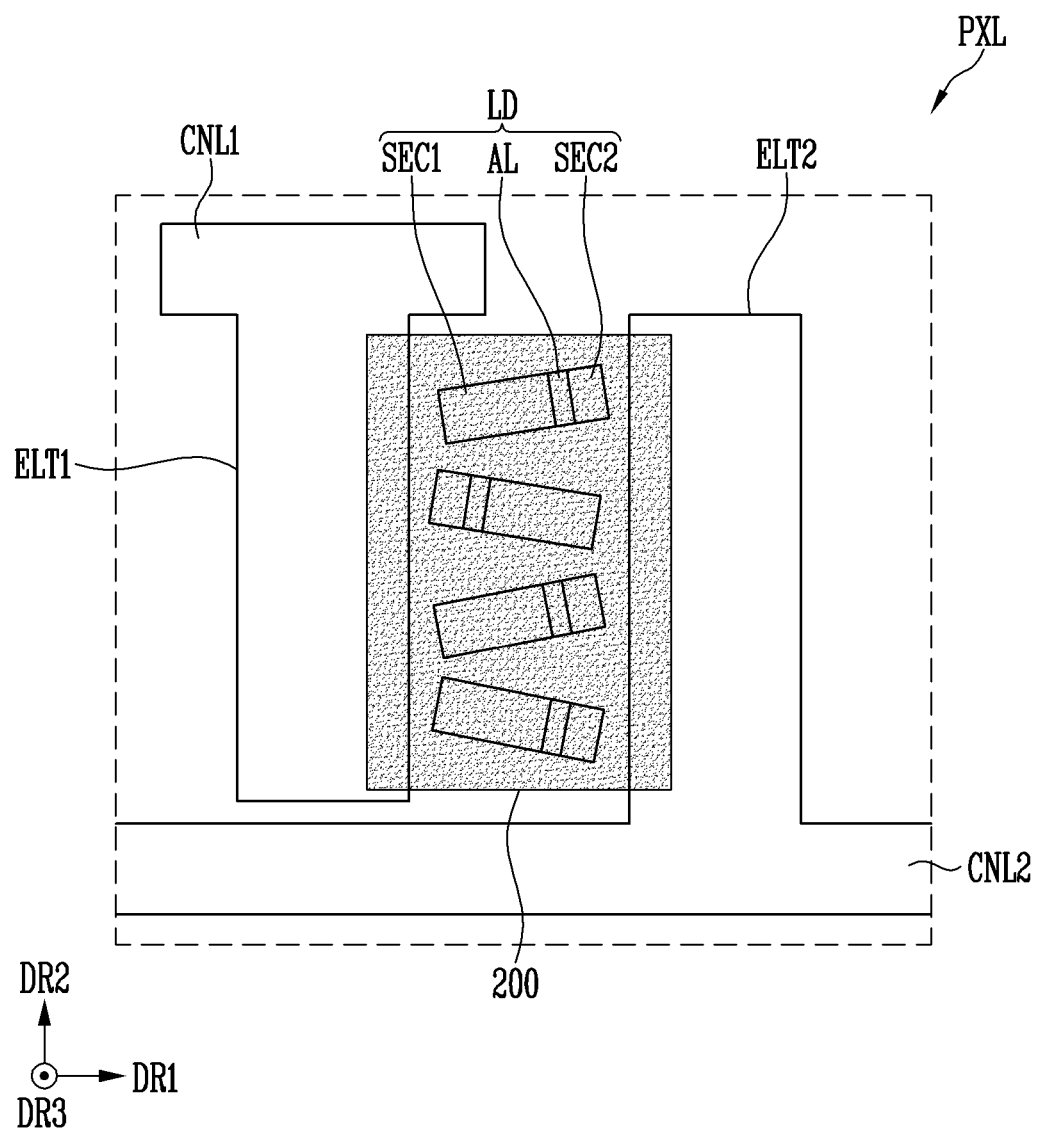
Figure 18:
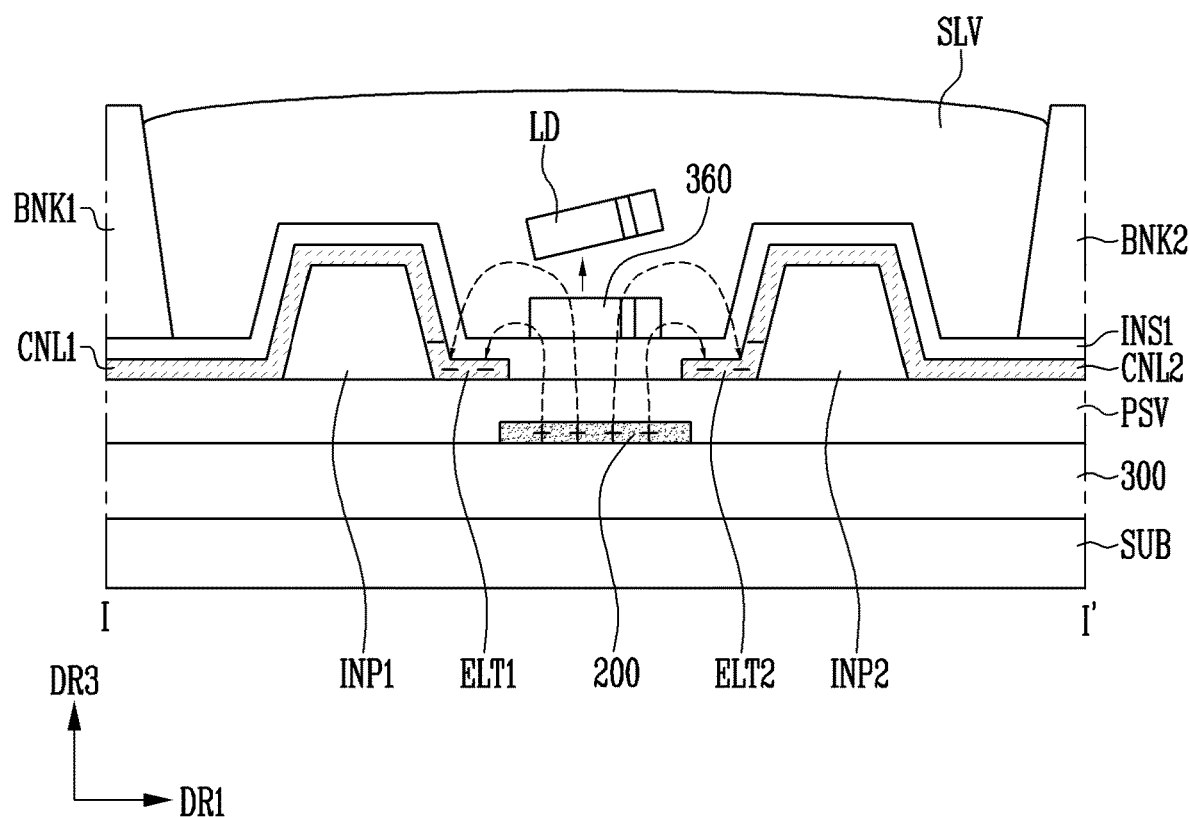

Referring to FIGS. 9, 17, and 18, in the step of performing the second alignment operation (S160), the light emitting element LD may be separated from the first electrode ELT1 and the second electrode ELT2 and may be lifted (S160). The step (the second alignment operation) may be referred to as a lift step.

In the step, the light emitting elements LD may be spaced apart from a position 360 arranged in an abnormal polarity direction to avoid contact with the first insulating layer INS1. For example, the light emitting element LD may be moved by an external force to be separated from the first insulating layer INS1. Accordingly, a separation distance between the light emitting element LD on which the second alignment operation may be performed and the first insulating layer INS1 may be greater than a separation distance between the light emitting element LD on which the first alignment operation may be performed and the first insulating layer INS1.

In the step, the light emitting element LD may be moved by an external force to be positioned adjacent to the first electrode ELT1 and the second electrode ELT2 in the solvent SLV.

In the step, the light emitting element LD may be moved by an electrophoresis force (EP) generated based on an electrical signal provided to the lifting electrode 200. According to an example, the lifting electrode 200 may provide the EP force for pushing the light emitting element LD in the third direction DR3 based on the provided electrical signal.

In the step, the light emitting element LD may avoid contact with the first insulating layer INS1, that is, a separation distance between the first electrode ELT1 and the second electrode ELT2 may be increased. Accordingly, in the step, the light emitting element LD may be provided in a state in which its position may be changed.

For example, an intensity of the external force required to change the position of the light emitting elements LD arranged at the positions 360 arranged in the abnormal polarity direction may be greater than an intensity of the external force required to change the position of the light emitting elements LD on which the second alignment operation may be performed to be spaced apart from the first insulating layer INS1.

Referring to FIG. 10 in relation to the step, in performing the second alignment operation (S160), a DC signal DC may be provided to the lifting electrode 200. For example, a relatively high potential may be formed in the lifting electrode 200, and a relatively low potential (for example, a ground power) may be formed in the first electrode ELT1 and the second electrode ELT2. Accordingly, an electric field may be formed between the first electrode ELT1 and the second electrode ELT2 and the lifting electrode 200. At this time, the light emitting element LD may receive an external force directed in the third direction DR3, may be spaced apart from the first insulating layer INS1, and may be dispersedly provided in the solvent SLV. A direction of the formed electric field may be indicated by an arrow having a dotted line in FIG. 18.

Here, the DC signal DC may be a signal provided within a second time period T2 in which the second alignment operation may be performed, and may be for separating the light emitting element LD from the first insulating layer INS1. For example, the DC signal DC may be for providing the EP force acting as an external force to the light emitting element LD.

According to an embodiment, the DC signal DC may have a magnitude suitable for lifting the light emitting element LD within the second time period T2. The DC signal DC may have a second magnitude A2. According to an embodiment, in order to move the position of the light emitting element LD, the second magnitude A2 may be greater than the first magnitude A1 based on a peak to peak (Vpp) scale. However, the disclosure is not limited thereto, and may be appropriately selected according to a process design structure.

Figure 19:
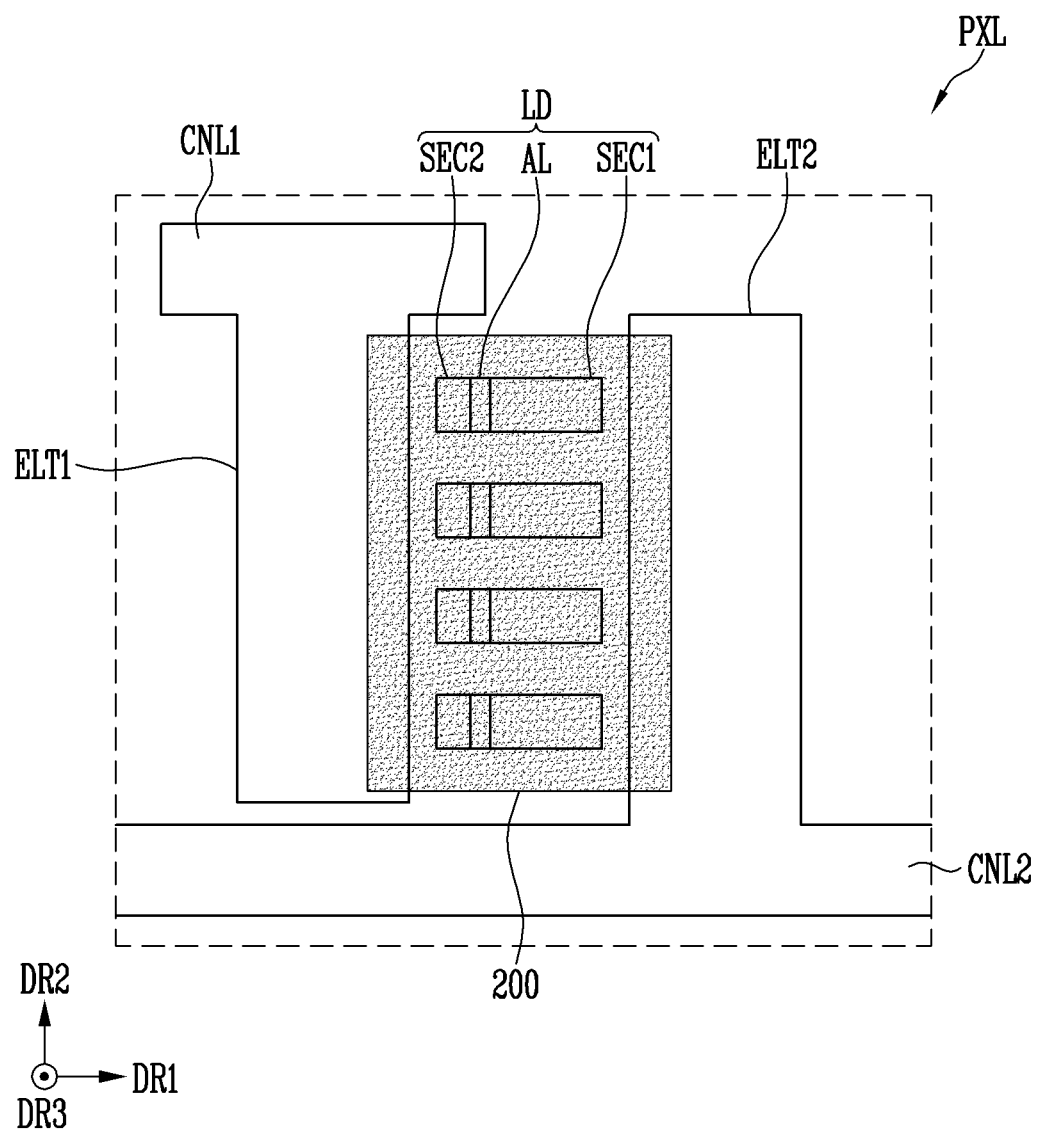
Figure 20:
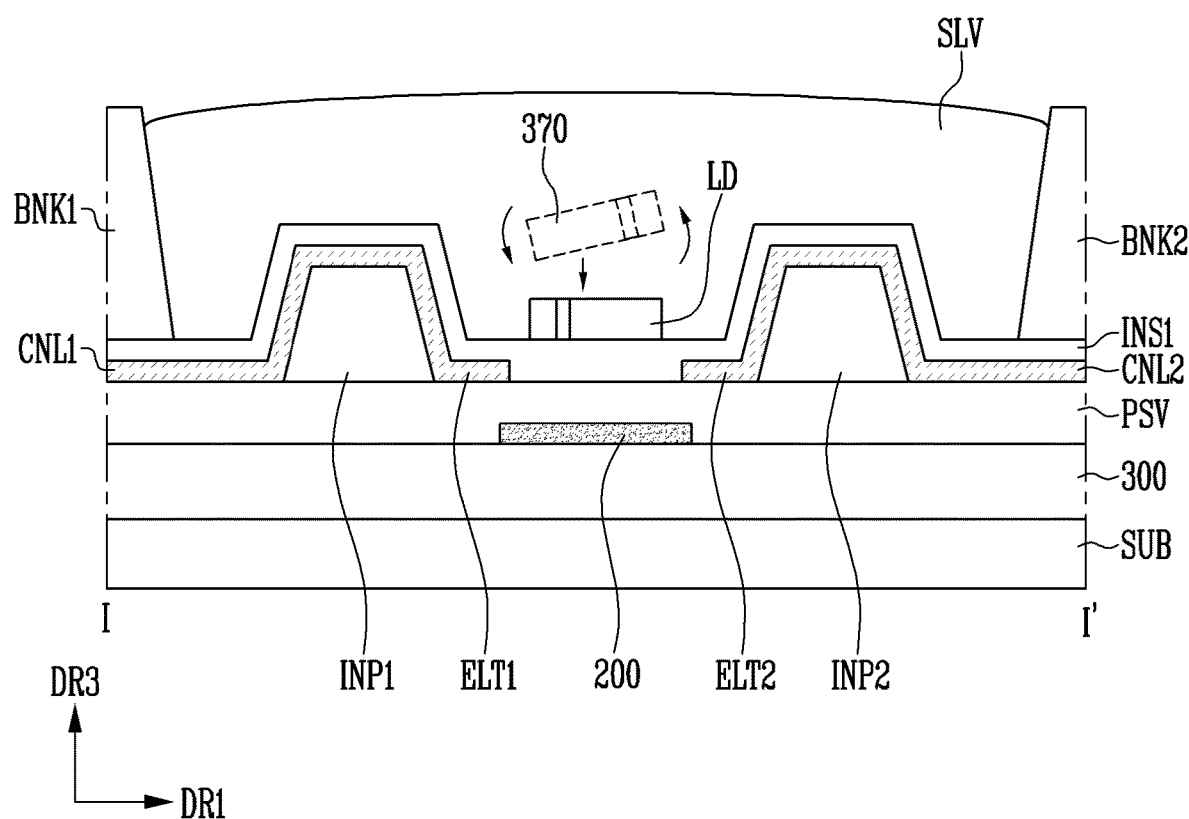

Referring to FIGS. 9, 19, and 20, in the third alignment operation (S170), the position of the light emitting element LD may be changed. In the step, the polarity directions of the light emitting elements LD may be arranged such that the light emitting element LD may be suitable for a normal operation. The step (the third alignment operation) may be referred to as a rotation step.

In the step, the light emitting element LD may be disposed adjacent to the first insulating layer INS1 from a position 370 spaced apart from the first insulating layer INS1. The position of the light emitting element LD may be changed to be positioned between the first electrode ELT1 and the second electrode ELT2.

In the step, the light emitting elements LD may be bias-aligned by the EP force generated based on the electrical signal provided to the first electrode ELT1 and the second electrode ELT2.

In the specification, the bias alignment may be a state in which the polarity direction of the light emitting element LD may be predominantly arranged in a direction, and may refer to an alignment state in which the light emitting element LD may be arranged to be suitable for the normal operation.

In the pixel PXL, the light emitting elements LD may be required to be bias-aligned. For example, in case that the anode signal is provided from the first electrode ELT1 and the cathode signal is provided from the second electrode ELT2 in order for the light emitting element LD to emit light, the first semiconductor layer SEC1 which may be the N-type semiconductor layer may be required to face the second electrode ELT2, and the second semiconductor layer SEC2 which may be the P-type semiconductor layer may be required to face the first electrode ELT1. As described above, a state in which the first semiconductor layer SEC1 faces the second electrode ELT2 and the second semiconductor layer SEC2 faces the first electrode ELT1 may be required to be bias-aligned.

In the step, the light emitting element LD may be arranged between the first electrode ELT1 and the second electrode ELT2, and the polarity direction of the light emitting element LD may be selected and arranged in a direction suitable for the normal operation.

For example, the second semiconductor layer SEC2 configured to receive the anode signal may be arranged to face the first electrode ELT1, and the first semiconductor layer SEC1 configured to receive the cathode signal may be arranged to face the second electrode ELT2 (Refer to FIG. 19). The polarity direction of the light emitting elements LD may be configured to allow the normal operation, and thus light may be emitted in case that an electric signal is applied.

Referring to FIG. 10 in relation to the step, in the step of performing the third alignment operation (S170), the second AC signal AC2 and the third AC signal AC3 may be provided to the first electrode ELT1 and the second electrode ELT2.

The second AC signal AC2 may be applied to the first electrode ELT1 and the second electrode ELT2 to form an electric field in an adjacent area during a third time period T3.

The third AC signal AC3 may be applied to the first electrode ELT1 and the second electrode ELT2 to form an electric field in an adjacent area during a fourth time period T4.

According to an embodiment, after the second AC signal AC2 may be applied, the third AC signal AC3 may be applied. According to an embodiment, after the second AC signal AC2 may be applied, the third AC signal AC3 may be continuously applied.

Here, the second AC signal AC2 may be a signal provided within the third time period T3 in which a portion of the third alignment operation may be performed, and may be for forming a dipole of the light emitting element LD to be suitable for subsequently generating rotation torque.

The third AC signal AC3 may be a signal provided within the fourth time period T4 in which a portion of the third alignment operation may be performed, and may be for bias-aligning the light emitting element LD by generating rotation torque in the light emitting element LD.

According to an embodiment, each of the second AC signal AC2 and the third AC signal AC3 may be at least one of a sine wave, a triangle wave, a staircase wave, a square wave, a trapezoidal wave, and a pulse wave, but is not limited thereto, and may have various AC signal types.

According to an embodiment, the second AC signal AC2 may be provided with the third magnitude A3 and the second frequency. The third magnitude A3 may be greater than the fourth magnitude A4 and less than the first magnitude A1. The second frequency may be greater than the first frequency of the first AC signal AC1, and thus a sufficient dipole may be formed in the light emitting element LD.

According to an embodiment, the third AC signal AC3 may be provided with the fourth magnitude A4 and a third frequency. The fourth magnitude A4 may be less than the third magnitude A3. The third frequency may be less than the second frequency, and thus sufficient rotation torque may be generated in the light emitting element LD.

According to an embodiment, the second time period T2, the third time period T3, and the fourth time period T4 may configure a cycle, and the cycle may be performed multiple times. However, the disclosure is not limited to the above-described example. For example, after the second time period T2 may be performed, the third time period T3 and the fourth time period T4 may configure one cycle, and the cycle may be performed multiple times.

According to an embodiment, before the light emitting element LD may be bias-aligned between the first electrode ELT1 and the second electrode ELT2, the light emitting element LD may be physically separated from the first insulating layer INS1, and thus less energy required to generate the rotational torque may be consumed. For example, a voltage intensity required during the third alignment operation may be reduced. According to an embodiment, the third magnitude A3 may be about 20 Vpp or less, and according to an embodiment, the third magnitude A3 may be about 10 Vpp or less. Finally, effects in which an arrangement of the light emitting elements LD may be relatively easier and a process cost reduction may result.

Figure 21:
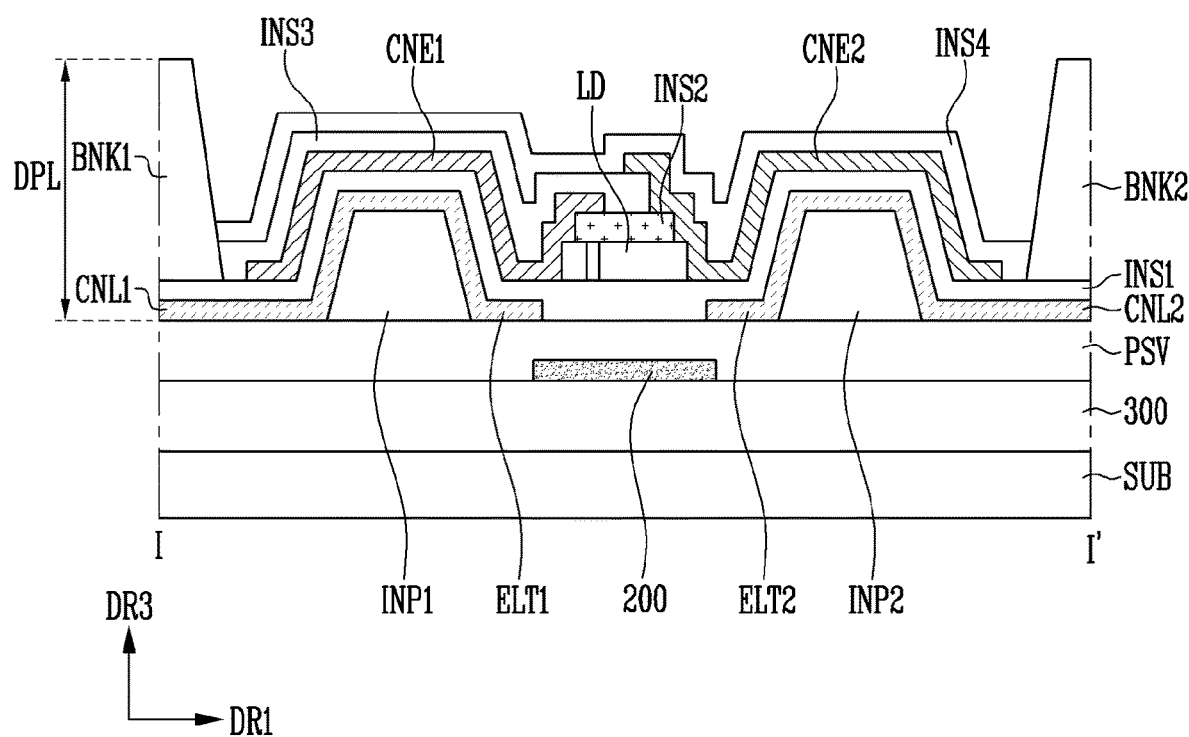

Referring to FIG. 21, the solvent SLV may be removed, the second insulating layer INS2 may be formed on the light emitting element LD, and the first contact electrode CNE1, the third insulating layer INS3, the second contact electrode CNE2, and the fourth insulating layer INS4 may be formed, to provide the display element part DPL according to an embodiment.

In the step, the second insulating layer INS2 may be disposed to overlap the active layer AL of the light emitting element LD.

In the step, the first contact electrode CNE1 may be electrically connected to the light emitting element LD, the third insulating layer INS3 may be disposed after the first contact electrode CNE1 may be provided, and the second contact electrode CNE2 may be provided. Accordingly, the third insulating layer INS3 may prevent the first contact electrode CNE1 and the second contact electrode CNE2 from being electrically shorted to each other. However, the disclosure is not limited thereto, and the first contact electrode CNE1 and the second contact electrode CNE2 may be formed in a same process according to an embodiment.

Accordingly, the display device DD according to an embodiment may be provided, and although not shown in the drawings, a planarization layer, a color conversion portion, and/or a color filter may be further disposed according to an embodiment.

The above description is merely an example of the technical spirit of the disclosure, and those skilled in the art to which the disclosure pertains will be able to make various modifications and variations without departing from the characteristics of the disclosure. Therefore, the embodiments of the disclosure described above may be implemented separately or in combination with each other.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims including equivalents thereof.

What is claimed is:

1. A display device comprising:
   a first electrode and a second electrode that are disposed on a substrate and spaced apart from each other;
   a light emitting element disposed between the first electrode and the second electrode;
   an auxiliary electrode disposed on the substrate and overlapping the light emitting element such that the auxiliary electrode forms an electric field in an area where the light emitting element is disposed; and
   a power supply line electrically connected to the auxiliary electrode and that provides power to the auxiliary electrode.

2. The display device according to claim 1, further comprising:
   a power line that provides power to the light emitting element through the second electrode; and
   a protective layer overlapping the power line,
   wherein the auxiliary electrode and the power line are disposed in a same layer.

3. The display device according to claim 1, further comprising:
   a transistor electrically connected to the light emitting element, the transistor including:
   a first transistor electrode;
   a second transistor electrode; and
   a gate electrode,
   wherein the auxiliary electrode and the gate electrode are disposed in a same layer.

4. The display device according to claim 1, further comprising:
   a transistor electrically connected to the light emitting element, the transistor including:
   a first transistor electrode;
   a second transistor electrode; and
   a gate electrode; and
   a lower electrode layer disposed on the substrate and having at least a portion overlapping the transistor,
   wherein the auxiliary electrode and the lower electrode layer are disposed in a same layer.

5. The display device according to claim 1, wherein the power supply line and the auxiliary electrode are disposed in different layers.

6. The display device according to claim 1, wherein the auxiliary electrode includes a reflective material such that the auxiliary electrode reflects light emitted from the light emitting element.

7. The display device according to claim 1, wherein the auxiliary electrode includes:
   a first overlap area overlapping the first electrode; and
   a second overlap area overlapping the second electrode.

8. The display device according to claim 1, wherein a separation distance between the auxiliary electrode and the first electrode is about 2 m or less in a thickness direction of the substrate.

9. The display device according to claim 1, further comprising:
a first contact electrode electrically connecting the first electrode and the light emitting element; and
a second contact electrode electrically connecting the second electrode and the light emitting element, wherein
a portion of the auxiliary electrode overlaps the first electrode and the first contact electrode, and
at least another portion of the auxiliary electrode overlaps the second electrode and the second contact electrode.

10. The display device according to claim 1, wherein
the first electrode and the second electrode are spaced apart in a first direction, and
the auxiliary electrode extends in a second direction intersecting the first direction.

11. A method of manufacturing a display device, the method comprising:
providing a lifting electrode on a substrate;
forming a protective layer on the lifting electrode;
providing a first electrode and a second electrode on the protective layer;
providing an ink including a light emitting element and a solvent on the substrate;
performing a first alignment operation of positioning the light emitting element between the first electrode and the second electrode by providing an electrical signal to the first electrode and the second electrode;
performing a second alignment operation of lifting the light emitting element by providing an electrical signal to the lifting electrode; and
performing a third alignment operation of changing a position of the light emitting element by providing an electrical signal to the first electrode and the second electrode and positioning the light emitting element between the first electrode and the second electrode.

12. The method according to claim 11, further comprising:
forming a lifting power supply line on the substrate; and
electrically connecting the lifting power supply line and the lifting electrode.

13. The method according to claim 11, further comprising:
forming a first bank and a second bank protruding in a thickness direction of the substrate on the protective layer thereby defining a space where a fluid is accommodated.

14. The method according to claim 13, wherein the providing of the ink comprises providing the ink between the first bank and the second bank.

15. The method according to claim 11, wherein
the light emitting element is provided in plural,
each light emitting element includes:
a first semiconductor layer that is an N-type semiconductor;
a second semiconductor layer that is a P-type semiconductor; and
an active layer disposed between the first semiconductor layer and the second semiconductor layer, and
after performing the first alignment operation, a portion of the light emitting element is disposed so that the first semiconductor layer faces the first electrode, and another portion of the light emitting element is disposed so that the first semiconductor layer faces the second electrode.

16. The method according to claim 15, further comprising:
forming an insulating layer overlapping the first electrode and the second electrode,
wherein the performing of the first alignment operation comprises contacting the insulating layer and the light emitting element with each other.

17. The method according to claim 16, wherein the performing of the second alignment operation comprises separating the light emitting element from the insulating layer so that a position of the light emitting element is changed.

18. The method according to claim 17, wherein the performing of the second alignment operation comprises preventing the light emitting element from contacting the insulating layer.

19. The method according to claim 17, wherein the performing of the third alignment operation comprises bias-aligning the light emitting element.

20. The method according to claim 11, wherein
the performing of the first alignment operation comprises providing a first AC signal to the first electrode and the second electrode, and
the performing of the second alignment operation comprises providing a DC signal to the lifting electrode.

21. The method according to claim 20, wherein
the performing of the third alignment operation is performed after the second alignment operation is performed, and
the method further comprises providing a second AC signal to the first electrode and the second electrode.

22. The method according to claim 21, wherein a frequency of the second AC signal is greater than a frequency of the first AC signal.

23. The method according to claim 21, wherein a magnitude of the first AC signal is greater than a magnitude of the second AC signal.

24. The method according to claim 21, wherein the performing of the third alignment operation is performed after providing the second AC signal and comprises providing a third AC signal to the first electrode and the second electrode.

25. The method according to claim 24, wherein a frequency of the third AC signal is less than a frequency of the second AC signal.

26. The method according to claim 24, wherein
the providing of the DC signal, the providing of the second AC signal, and the providing of the third AC signal configure a single cycle, and
the single cycle is performed a plurality of times.

27. The method according to claim 24, wherein
the providing of the second AC signal and providing the third AC signal configure a single cycle, and
the single cycle is performed a plurality of times.

28. The method according to claim 24, wherein magnitudes of the second AC signal and the third AC signal are less than about 10 Vpp.

29. A method of manufacturing a display device, the method comprising:
providing a lifting electrode on a substrate;
forming a protective layer on the lifting electrode;
providing a first electrode and a second electrode on the protective layer;
providing an ink including a light emitting element and a solvent on the substrate;
performing a landing step of providing a first AC signal to the first electrode and the second electrode to position the light emitting element between the first electrode and the second electrode;

performing a lifting step of providing a DC signal to the lifting electrode to separate the light emitting element from the first electrode and the second electrode; and performing a rotation step of changing a position of the light emitting element by providing a second AC signal and a third AC signal successively to the first electrode and the second electrode.

\* \* \* \* \*